US011531789B1

(12) United States Patent
Eberhardt et al.

(10) Patent No.: US 11,531,789 B1
(45) Date of Patent: Dec. 20, 2022

(54) FLOOR PLAN GENERATION FOR DEVICE VISUALIZATION AND USE

(71) Applicant: Amazon Technologies, Inc., Seattle, WA (US)

(72) Inventors: Sven Eberhardt, Seattle, WA (US); Clare Elizabeth Veladanda, Sunnyvale, WA (US); Akshay Kumar, Seattle, WA (US); Aniruddha Basak, Seattle, WA (US); Charles Edwin Ashton Brett, Seattle, WA (US); William Evan Welbourne, Seattle, WA (US); Jatin Bajaj, Santa Clara, CA (US)

(73) Assignee: Amazon Technologies, Inc., Seattle, WA (US)

( * ) Notice: Subject to any disclaimer, the term of this patent is extended or adjusted under 35 U.S.C. 154(b) by 501 days.

(21) Appl. No.: 16/586,402

(22) Filed: Sep. 27, 2019

(51) Int. Cl.
*G06F 30/13* (2020.01)
*G06T 17/10* (2006.01)
*G06F 3/04817* (2022.01)
*G06T 15/20* (2011.01)
*H04W 16/20* (2009.01)
*G06F 30/18* (2020.01)
*G10L 15/18* (2013.01)
*G10L 15/22* (2006.01)

(52) U.S. Cl.
CPC .......... *G06F 30/13* (2020.01); *G06F 3/04817* (2013.01); *G06F 30/18* (2020.01); *G06T 15/205* (2013.01); *G06T 17/10* (2013.01); *H04W 16/20* (2013.01); *G10L 15/18* (2013.01); *G10L 15/22* (2013.01); *G10L 2015/223* (2013.01)

(58) Field of Classification Search
CPC ...... G06F 30/13; G06F 3/04817; G06F 30/18; G06T 15/205; G06T 17/10; H04W 16/20
See application file for complete search history.

(56) References Cited

U.S. PATENT DOCUMENTS

| | | | |
|---|---|---|---|
| 2008/0073431 A1* | 3/2008 | Davis | G06K 17/0022 235/383 |
| 2017/0299210 A1* | 10/2017 | Nyamjav | H04L 12/282 |
| 2018/0075168 A1* | 3/2018 | Tiwari | G06T 7/0004 |
| 2018/0351762 A1* | 12/2018 | Iyengar | G05B 15/02 |

* cited by examiner

*Primary Examiner* — Rehana Perveen
*Assistant Examiner* — Troy A Maust
(74) *Attorney, Agent, or Firm* — Lee & Hayes, P.C.

(57) ABSTRACT

Systems and methods allow for floor plan generation for device visualization and use. For example, image data may be utilized to segment a building from non-building elements in an image, and the outline of the building may be utilized to generate a floor plan of the building. A user interface may be generated to present the floor plan and allow for placement of representations of walls, doors, windows, and electronic devices within the floor plan. Placement of these elements may be performed in response to input from a user and/or may be performed automatically utilizing naming indicators, device-affinity data, historical usage data, signal-strength data, etc. Once placed, the device representations may be utilized to operate the devices and display related information, such as alerts.

20 Claims, 13 Drawing Sheets

900

Generate, based at least in part on first data including image of building, second data representing floor plan of building, floor plan representing first coordinates of coordinate system that correspond to exterior wall representations arranged in shape of building
902

↓

Determine third data indicating second coordinates that correspond to location of device associated with building
904

↓

Generate, based at least in part on first coordinates and second coordinates, user interface including: first visual representation of floor plan; second visual representation of device positioned on first visual representation, second visual representation selectable to cause operation of device
906

FIG. 9

Selection Data 1210

| Candidates | Arbitration Outcome |
|---|---|
| A, B | A: 75% B: 25% |
| C, D | C: 20% D: 80% |
| D, E | D: 70% E: 30% |
| C,D,E | C: 10% D: 70% E: 20% |
| F,G | F: 25% G: 75% |

Acoustic Region Data 1220

| Acoustic Region | Devices | Default Device |
|---|---|---|
| 1 | A, B | A |
| 2 | C,D,E | D |
| 3 | F,G | G |

FIG. 12

FLOOR PLAN GENERATION FOR DEVICE VISUALIZATION AND USE

BACKGROUND

Use of electronic devices to perform actions has become common. Some environments, such as homes, may include multiple connected devices as well as one or more voice-enabled devices that may be utilized to control operation of the connected devices. Described herein are improvements in technology and solutions to technical problems that can be used to, among other things, assist in control of connected devices.

BRIEF DESCRIPTION OF THE DRAWINGS

The detailed description is set forth below with reference to the accompanying figures. In the figures, the left-most digit(s) of a reference number identifies the figure in which the reference number first appears. The use of the same reference numbers in different figures indicates similar or identical items. The systems depicted in the accompanying figures are not to scale and components within the figures may be depicted not to scale with each other.

FIG. 9 illustrates a flow diagram of another example process for floor plan generation for device visualization and use.

FIG. 12 illustrates examples of a building with multiple devices, determining acoustic regions based on selection data, and determining default devices for the acoustic regions according to embodiments of the present disclosure.

DETAILED DESCRIPTION

Figure 1:
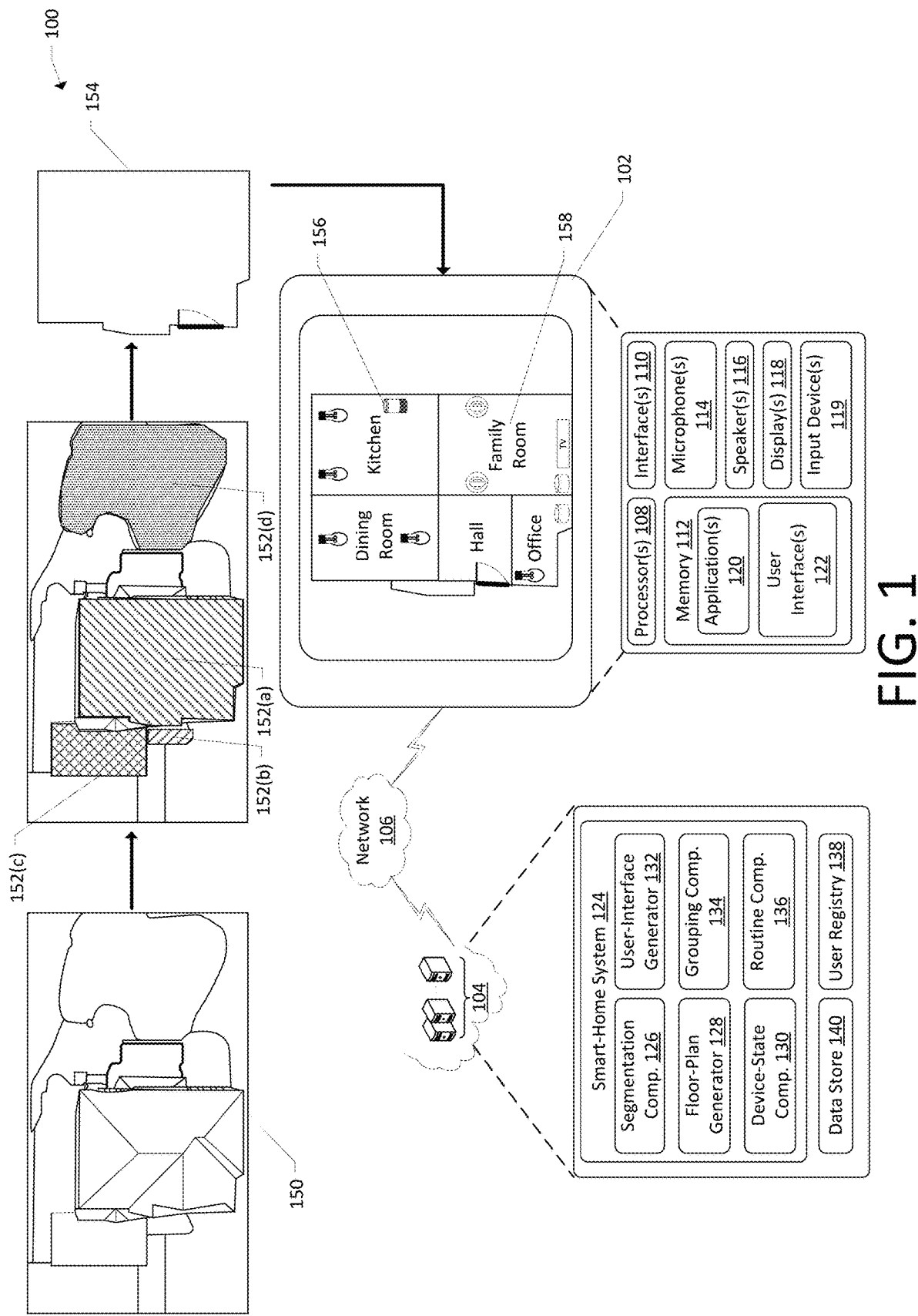
FIG. 1 illustrates a schematic diagram of an example environment for floor plan generation for device visualization and use.

Systems and methods for floor plan generation for device visualization and use are disclosed. Take, for example, a building that includes one or more electronic devices such as voice-enabled devices (e.g., Echo devices, mobile phones, tablets, personal computers, etc.) and other types of connected (e.g., "smart") devices (e.g., lights, plugs, locks, thermostats, appliances, televisions, clocks, smoke detectors, doorbells, security camera, security-system contacts, etc.). The connected devices may be controlled using the voice-enabled devices, via touch input to a user device such as a tablet, and/or by physically operating the connected devices themselves. In some examples, a given building may be associated with many voice-enabled devices and/or many connected devices dispersed across many rooms of the building. In these examples, it may be beneficial to know where each of the electronic devices are with respect to the building, the operational states of those devices, and/or relationships among devices.

To do so, a remote system, such as a system associated with at least a portion of the electronic devices, may generate data representing a floor plan of the building and generate a graphical user interface showing the floor plan, including relative locations of device with respect to the walls shown in the floor plan. For example, the system may receive satellite image data associated with an address. Using computer vision technology and the satellite image data, a building's shape can be identified. The system may only receive and/or utilize the image data associated with the building after receiving a request or other representation of consent to receive and/or utilize such image data. In examples, the image data may correspond to a bird's eye view, a directly overhead view and/or any other view(s) of the building. The image data may additionally or alternatively correspond to a side view of the building, such as from a street next to the building, external (security, home-monitoring) cameras, and/or interior cameras inside the building. Utilizing the image data, the system may utilize one or more computer vision techniques and/or models, such as image segmentation models, to determine the portions of the image that correspond to the building and portions of the image that correspond to non-building components. For example, the portions of the image corresponding to the building may be tagged as "building," and other portions of the image may be tagged as "non-building" or may be tagged as other objects such as "driveway," "sidewalk," "porch," "deck," "patio," "grass," "garden," "tree," etc. Segmentation data may be generated that utilizes the tags to separate building components from non-building components of the image. An outline of the building may be generated by utilizing the segmentation data to determine where building components and non-building components meet.

The outline of the building may then be utilized, such as by a floor-plan generator of the system, to generate a floor plan of the building. For example, the outline may be utilized to generate floor-plan data indicating the exterior shape of the building and including exterior walls. Coordinates may be assigned to the representation(s) of the exterior walls in the grid-based coordinate system as described in more detail below. Additionally, when a sidewalk is tagged in the image data, that information may be utilized to determine a location of one or more doors to the building. Representations of these doors may be included in the floor-plan data and may show an approximate location of the doors with respect to the exterior walls. Additionally, when a driveway, deck or equivalent, or grass area is tagged in the image data, that information may be utilized to determine potential flat areas associated with the building. Those flat areas may be utilized for delivery of items, such as items purchased in an online marketplace, to the building. Additionally, the image data and/or other data associated with the building may be utilized to determine a number of levels of the building and/or outlines of the levels. For example, a side view image of the building may be utilized to determine if the building is a single-level building or multi-level building. Other information such as the square footage of the building, a description of the number of rooms and/or types of rooms of the building, and/or naming indicators associated with the electronic devices may be utilized to determine building levels. For example, when the square footage of the home is approximately twice the amount of the area of the generated floor plan, this information may indicate that the building has two roughly equal levels. In other examples, data indicating that the building contains many bedrooms and/or bathrooms, a basement, a loft, etc. may indicate that the building is a multi-level building. In other examples, the device naming indicators such as "basement light," "main floor lights," and/or "upstairs lights," may indicate that the building includes multiple levels. Some or all of this information may be utilized by the floor-plan generator to generate the floor plans described herein.

Additionally, if images of the interior of the building have been made publicly available and/or the user has otherwise provided consent to the use of such images generally and/or for the purposes described in this disclosure, corresponding image data may be utilized to determine the presence and location of interior walls of the building. In these examples, representations of these interior walls may be included in the floor plan. In other examples where such image data is not available and/or consent to utilize such data is not available or has not been provided, a user interface may be generated with functionality that allows for a user to use an graphical user interface editing tool to add interior walls to the floor plan. For example, a user-interface generator may generate a user interface that includes a visual representation of the floor plan. The user interface may also include a library of objects that may be added to the floor plan, such as by touch input on a user device displaying the user interface. In these examples, the object library may include a "wall" icon that, when selected, may allow a user to provide input to the user device indicating where one or more walls are located with respect to the floor plan. The user interface may be configured to allow the user to manipulate the size and position of the walls. Additional icons such as a "door" icon and/or a "window" icon may be caused to be displayed on the user interface and may be utilized by the user to place and/or size doors and windows, respectively. The user may also utilize the user interface to correct and/or change the sizing and/or placement of the exterior walls and/or interior walls as determined by the floor-plan generator. It should be understood that while the sizing and placement of object representations is described herein with respect to example objects such as walls, doors, and windows, the object library may contain these and/or other object icons associated with any number of objects associated with a building. It should also be understood that while several of the examples herein are associated with a home, the building may include any structure that may include electronic devices.

The system may also be configured to place and/or enable placement of visual representations of electronic devices with respect to the floor plan. For example, the object library may include one or more visual representations of the electronic devices associated with the building. In these examples, the system may query a user registry to determine which electronic devices are associated with the building. By way of example, a voice-enabled device may be disposed within the building and that voice-enabled device may be associated with account data indicating the address of the building, user identifier data, one or more other voice-enabled devices associated with the building, and/or one or more connected devices associated with the voice-enabled device(s). Visual representations of these electronic devices may be generated and may be included in the object library. The visual representations may include icons of the devices, which may be generic device icons and/or may be based at least in part on the device type of a given device, and/or text showing a naming indicator for the device. The naming indicator may correspond to a device name provided by a user and/or a device name provided by a smart-device system associated with the device and/or a device name determined by the speech-processing system. In these examples, the user interface may be configured to allow the user to select the device representations from the object library and to move them to the floor plan representation. By doing so, the user may provide input on the placement of the devices within the building and/or the rooms of the building. The user interface may also allow the user to change the name of a given device, change the icon, and/or provide an indication of the device type. The user may also provide an indication when a device disposed within the building is not included in the icon library. Such input may cause one or more of the voice-enabled devices and/or the speech-processing system to initiate a device discovery process to identify the missing device(s) and include a representation of the device(s) in the user interface.

In other examples, data associated with the floor plan and/or the devices may be utilized to automatically place the visual representations of the devices on the floor plan. For example, the user interface may allow a user to label one or more rooms of the floor plan, such as labelling the rooms as "kitchen," "family room," office," "dining room," "hallway," etc. When room labels such as these are provided, the system may utilize the naming indicators of the devices to determine where device representations should be placed. For example, the devices may include devices with the naming indicators of "Kitchen Light 1," "Kitchen Light 2," "Family Room Speaker 1," and "Family Room Speaker 2." In these examples where room labels have been identified, the device representations associated with such room labels may be placed in their respective rooms. For example, if a room of the floor plan is labeled "Kitchen," the device representations associated with device naming indicators that include "kitchen" or similar words may be placed on the portion of the floor plan corresponding to the kitchen.

Alternatively, when room labels have not been provided but device naming indicators are known, the device naming indicators may be utilized to generate room labels and place devices. Utilizing the example provided above, a user may provide input such as moving the device representation for "Kitchen Light 1" from the object library to a representation of a room of the floor plan. The system may receive input data corresponding to that input and may utilize the input data to generate a "Kitchen" room label for the room in question. The system may also determine which other devices have naming indicators that include "kitchen" or a similar word and may place corresponding device representations in the "Kitchen" portion of the floor plan. Additionally, in examples where the account data indicates groupings of devices, those groupings may be utilized to inform which devices are to be associated with which room labels.

Additionally, or alternatively, the system may utilize signal-strength data and/or device-affinity data to determine placement of devices with respect to the floor plan. For example, as the devices are utilized, usage data associated with the devices may be generated. That usage data may include device-affinity data indicating which connected devices communicate with which voice-enabled devices most frequently. The usage data may also include signal-strength data indicating a signal strength, such as for communication signals sent between devices utilizing one or more communication protocols. Stronger signal strength may indicate that the two devices are physically closer to each other than two devices having lower signal strength. Additionally, with respect to the voice-enabled devices, the voice-enabled devices may include multiple microphones for capturing audio. The microphones may be arranged in an array and may be configured to each receive audio from the environment and generate audio data corresponding to the audio. The audio data may be analyzed to determine the direction of the source of the audio with respect to the microphones. This information, as well as acoustic echo information for example, may be utilized by the voice-enabled devices to determine a location of the voice-enabled devices within a given room.

In examples, a device may be selected as an "anchor," otherwise described as a reference device, and the reference device may be utilized to assist in placement of other device representations on the floor plan. For example, a doorbell device may be selected as the reference device based at least in part on the device type and/or data indicating a location of an exterior door was determined from the image data. In these examples, the system may determine that the doorbell device is likely positioned next to the door and therefore the device representation of the doorbell device may be placed on the floor plan at the portion associated with the door. From there, one or more data as described elsewhere herein may be utilized to determine the placement of some or all of the other device representations. For example, signal strength data and/or device affinity data may be utilized to determine spatial relationships between devices and those relationships may be utilized to place device representations on the floor plan. While device type is utilized in this example for determining which device to utilize as the reference device, other information such as the naming indicator of a device or other data may be utilized to select the reference device.

Once the device representations are placed with respect to the floor plan, the user interface may enable functionality that allows for control of the devices utilizing a user device. For example, the user interface may be displayed on the user device and may include the floor plan and the device representations. The device representations may be selectable, or the user device may otherwise be configured to receive user input to operate the devices. For example, the user device may include a touchscreen and the user may touch a portion of a screen of the user device that is displaying a given device representation, such as a device representation associated with a light. The user device may generate corresponding input data indicating selection of the device representation, which may cause the user device to generate a request to operate the device. In other examples, the input data may be sent to a voice-enabled device, the speech-processing system, and/or another device or system, which may generate the request to operate the device. The request may be sent to the connected device corresponding to the device representation, and the connected device may process the request and perform the indicated operation. In examples, the connected device may send a response indicating that the operation has been performed, and in these examples the user interface may cause display of an indication that the operation has been performed. By way of example, the light device representation may change color, size, emphasis, etc. to indicate that the light has been turned on. In examples, the connected device may be configured to perform multiple functions and/or may have multiple options for performing such functions, such as a dimness of light emission, a light color, etc. In these examples, the user interface may include options associated with such functionality, which may be displayed based at least in part on selection of the device representation. It should be understood that while the state of the device may be received from the connected device at issue, data indicating the state of the device may additionally, or alternatively, be received by the smart-device system and/or the speech-processing system.

Additionally, or alternatively, the system may be configured to group devices based at least in part on received user input from the user interface and/or based at least in part on the placement of device representations with respect to the floor plan. For example, a user may select multiple device representations, such as by drawing a line around the representations, and may indicate that the selected devices should be grouped. In these examples, a device group may be generated that indicates the device identifiers associated with the selected devices and/or the device group may be given a group naming indicator, such as by the user or as determined based at least in part on the devices at issue and/or the naming indicators of the devices. Additionally, when multiple device representations are placed in a room of the floor plan, the corresponding devices may be grouped, and the device group may be associated with a naming indicator corresponding to that room label.

Additionally, or alternatively, the system may be configured to determine routines associated with the devices. For example, in addition to device representations, sensor representations may also be included in the user interface. Those sensor representations may include, for example, representations of motion sensors, presence sensors such as sensors to determine if a sound source has entered a given room, contact sensors such as those utilized in security equipment, etc. The user interface may be configured to allow a user to select the sensor representations and associate them with one or more of the device representations to create routines. For example, a user may select a motion-sensor representation and may also select or otherwise indicate selection of a light device representation. By so doing, the user may indicate that the user desires to create a routine where the light device corresponding to the light device representation operates when motion is detected by the motion sensor corresponding to the motion sensor representation. In these examples, input data corresponding to the user input may be utilized to determine that a routine is to be generated and the user interface may include functionality to assist in acquiring additional inputs to setup the routine. For example, the user device may be caused to display a "routine setup" window that includes options associated with the routine. The options may be dependent on the connected device being operated and/or the sensor at issue. In the example of a smart light device, the options may include an indication of whether the light should be turned on or off, a brightness level of the light, a color of the light, and/or times of day and/or days of the week that the light should be maintained in the requested state. For example, the user may select the options such that the routine includes turning the light on to a given brightness level and color from 6:00 am to 10:00 pm when motion is detected by the motion sensor at issue. The user device may also be caused to display an indication that the routine has been created and may indicate the existence of the routine on the user interface, such as by utilizing a symbol and/or changing the color, size, and/or format of the device representation(s) associated with the routine. In other examples, based on the home layout, and the location of, for example a heater and/or air conditioner, a thermostat device may increase comfort and save energy in some cases. For instance, a home might have a large living room and heater in one corner. When a user returns home from work, the entire living space might not be adequately warm. The routines described herein may be utilized to start the heater a bit earlier than "usual return-to-home" time of user. These control may be tuned based at least in part on the floor plan.

Additionally, or alternatively, the system may be configured to determine one or more alerts associated with the device(s) and cause the user interface to include an indication of such alerts for display on the user device. For example, device usage data and/or other data such as weather data, scheduling data, security-system data, presence data, device-state data, etc. may be utilized to determine the typical state of the device(s) under given circumstances and whether, at a given time, the state of a given device differs from the typical state. For example, the device-usage data may indicate that the Kitchen Light 1 device is typically off from 10:00 pm to 5:00 am, but that at 11:00 pm the Kitchen Light 1 device is on. As another example, a contact sensor may indicate that a window of the building is currently open and weather data may indicate a high likelihood of precipitation. In these examples, an alert may be generated and may cause the user interface to include an indication of the alert on the user device. The indication may include any indication, such as for example a change in color of the device representation and/or the room associated with the device representation, a textual alert, an audible alert, etc. Upon selection of the alert, the user interface may include functionality for display of an option to take corrective action, such as selectable portions for turning off the light, locking a door, turning off a speaker, etc.

In addition to the above, the placement of device representations in the user interfaces described herein may be utilized to generate location data indicating the locations of the devices with respect to the building and with respect to each other. This data may be utilized by one or more components of the speech-processing system to assist in performing functions of those components. For example, the location data may be utilized for implicit targeting, such as in situations where a user provides a request such as "turn on the light" but does not explicitly provide a naming indicator for the light. The location data may also be utilized to determine which network access points should be configured to communicate with given connected devices, which voice-enabled devices should be configured to respond to certain user requests, etc.

When representations of devices and/or other objects such as walls, windows, doors, etc. are described as being positioned in association with a given floor plan, such placement may be based on a spatial relationship between the devices and/or objects. For example, a grid-based coordinate system may be generated and may be utilized to assign coordinates in the coordinate system to the various representations. For example, the grid-based coordinate system may include coordinates in two or more dimensions and the coordinate system may be generated to represent a to-scale representation of the building in question and the objects and/or devices associated with that building. By way of example, when a floor plan is generated as described herein, representations of the exterior walls of the building may be assigned coordinates in the coordinate system. These coordinates may be utilized by the system to determine where the exterior walls are with respect to each other and with respect to objects associated with the building. Likewise, the device and object representations may also be assigned coordinates to indicate where in the coordinate system those representations should be located. The device-associated data described herein, such as device-affinity data, signal-strength data, selection data, and/or acoustic region data may be utilized to determine physical distances between devices and/or to determine sections of the floor plan that should include the devices. This information may be utilized to determine which coordinates of the coordinate system should be assigned to the device representations. It should be understood that while a grid-based coordinate system is utilized herein, one or more other systems to represent the spatial relationship between objects and/or devices may be utilized.

The present disclosure provides an overall understanding of the principles of the structure, function, manufacture, and use of the systems and methods disclosed herein. One or more examples of the present disclosure are illustrated in the accompanying drawings. Those of ordinary skill in the art will understand that the systems and methods specifically described herein and illustrated in the accompanying drawings are non-limiting embodiments. The features illustrated or described in connection with one embodiment may be combined with the features of other embodiments, including as between systems and methods. Such modifications and variations are intended to be included within the scope of the appended claims.

Additional details are described below with reference to several example embodiments.

FIG. 1 illustrates a schematic diagram of an example system 100 for floor plan generation for device visualization and use. The system 100 may include, for example, a user device 102 configured to display one or more user interfaces. The user device 102 may be configured to receive data associated with the user interfaces, receive user input, and/or generate input data corresponding to the user input. The system 100 may also include a remote system 104 configured to communicate with the user device 102, such as via a network 106. The remote system 104 may be at least in part a speech-processing system associated with one or more voice-enabled devices. The voice-enabled devices may be configured to receive user utterances and perform operations in response to such user utterances. In these examples, the voice-enabled devices may be "hands free" such that interactions with the voice-enabled devices are performed through audible requests and responses. It should be understood that the user device 102 may be a voice-enabled device.

The user device 102 may include one or more components, such as, for example, one or more processors 108, one or more network interfaces 110, memory 112, one or more microphones 114, one or more speakers 116, one or more displays 118, and/or one or more input devices 119. The microphones 114 may be configured to capture audio, such as user utterances, and generate corresponding audio data. The speakers 116 may be configured to output audio, such as audio corresponding to audio data received from another device and/or the system 104. It should be understood that while several examples used herein include a user device 102 that allows users to interact therewith via user utterances, one or more other devices, which may not include a voice interface, may be utilized instead of or in addition to user devices 102. In these examples, the device may be configured to send and receive data over the network 106 and to communicate with other devices in the system 100. As such, in each instance where a user device is utilized, a computing device that does not include a voice interface may also or alternatively be used. The displays 118 may be configured to display media, such as text, corresponding to media data and/or input data that may be received, for example, from the remote system 104. The displays 118 may also be configured to display one or more user interfaces as described herein. The input devices 119 may include devices for a user to provide input to the user device 102. Examples of input devices 119 may include touchscreens, keyboards, a mouse, virtual-reality remotes, controllers such as remote controls, etc. The memory 112 may include one or more components such as, for example, one or more applications 120 residing on the memory 112 and/or accessible to the user device 102. The applications(s) 120 may be configured to cause the processor(s) 108 to receive information associated with interactions with the user device 102 and cause display of representations, such as text and/or images, associated with the interactions. The application(s) 120 may also be utilized, in examples, to receive input, such as from a user of the user device 102, and send corresponding data and/or instructions associated with the input to the remote system 104. The memory 112 may also include, for example, one or more user interfaces 122. The user interfaces 122 may include the user interfaces 122 generated for device visualization and use as described more fully herein. It should be understood that when user devices are described herein, those user devices may include phones, computers, and/or other computing devices.

The remote system 104 may include components such as, for example, a smart-home system 124, a user registry 138, and/or one or more data stores 140. It should be understood that while the smart-home system 124, the user registry 138, and the data store(s) 140 are depicted as separate from each other in FIG. 1, some or all of the components may be a part of the same system. The remote system 104 may also include a speech-processing system (not shown), which may include an automatic speech recognition component (ASR), a natural language understanding component (NLU), and/or a text-to-speech component (TTS). The smart-home system 124 may include a segmentation component 126, a floor-plan generator 128, a device-state component 130, a user-interface generator 132, a grouping component 134, and/or a routine component 136. Each of the components described herein with respect to the remote system 104 may be associated with their own systems, which collectively may be referred to herein as the remote system 104, and/or some or all of the components may be associated with a single system. Additionally, the remote system 104 may include one or more applications, which may be described as skills, actions, and/or capsules. For example, a skill may receive data representing an intent. For example, an intent may be determined by the NLU component and/or as determined from user input via a computing device. Skills may be configured to utilize the intent to output data for input to the TTS component, a link or other resource locator for audio data, and/or a command to a device, such as the user device 102.

In instances where a user device 102 is utilized, skills may extend the functionality of connected devices that can be controlled by users utilizing a voice-user interface. In some examples, skills may be a type of application that may be useable in association with connected devices and may have been developed specifically to work in connection with given connected devices. Additionally, skills may be a type of application that may be useable in association with an electronic device and may have been developed specifically to provide given functionality to the electronic device. In examples, a non-skill application may be an application that does not include the functionality of a skill. Speechlets, as described herein, may be a type of application that may be usable in association with electronic devices and may have been developed specifically to work in connection voice interfaces of with electronic devices. The application(s) may be configured to cause processor(s) to receive information associated with interactions with the user device 102. The application(s) may also be utilized, in examples, to receive input, such as from a user of the user device 102, and send data and/or instructions associated with the input to one or more other devices.

The components of the remote system 104 are described in detail below. In examples, some or each of the components of the remote system 104 may include their own processor(s), network interface(s), and/or memory. As such, by way of example, the speech-processing system may include and/or be associated with processor(s), network interface(s), and/or memory. The smart-home system 124 may include and/or be associated with different processor(s), network interface(s), and/or memory, or one or more of these components may utilize some or all of the same processor(s), network interface(s), and/or memory utilized by the speech-processing system. These components are described in detail below. Additionally, the operations and/or functionalities associated with and/or described with respect to the components of the remote system 104 may be performed utilizing cloud-based computing resources. For example, web-based systems such as Elastic Compute Cloud systems or similar systems may be utilized to generate and/or present a virtual computing environment for performance of some or all of the functionality described herein. Additionally, or alternatively, one or more systems that may be configured to perform operations without provisioning and/or managing servers, such as a Lambda system or similar system, may be utilized.

With respect to the components of the remote system 104, the segmentation component 126 may be configured to receive, as input, image data corresponding to one or more images 150 that include a building. For example, the system 104 may receive image data associated with the building. In examples, the image data may correspond to a bird's eye view of the building, such as from satellite imagery as illustrated in FIG. 1. In other examples, the image data may additionally or alternatively correspond to a side view of the building, such as from a street next to the building and/or the image data may correspond to images of the interior of the building. Utilizing the bird's eye view image data, the segmentation component 126 may utilize one or more computer vision techniques and/or models, such as image segmentation models, to determine the portions of the image 150 that correspond to the building and portions of the image 150 that correspond to non-building components. For example, the portions of the image 150 corresponding to the building may be tagged as "building," and other portions of the image 150 may be tagged as "non-building" or may be tagged as other objects such as "driveway," "sidewalk," "porch," "deck," "patio," "grass," "garden," "tree," etc. Segmentation data may be generated that utilizes the tags to separate building components from non-building components of the image 150. An outline of the building may be generated by utilizing the segmentation data to determine where building components and non-building components meet. For example, one or more objects may be identified and the perimeter and/or area of those objects with respect to the image 150 may be determined. Object representations 152(*a*)-(*d*) corresponding to the objects may be generated. As shown in FIG. 1, the four object representations 152(*a*)-(*d*) may include a building, a sidewalk, a driveway, and a grass area.

The computer vision techniques described herein may utilized computer vision module(s) (CVM). The CVM may receive, as input, the image data, and generate, as output, metadata associated with the image. The metadata may include information such as the presence of a particular type of object (e.g., building, sidewalk, driveway, grass, person, animal, vehicle, parcel, etc.), a distance of the object from other objects, etc.

Computer vision includes methods for acquiring, processing, analyzing, and understanding images and, in general, high-dimensional data from image data in order to produce numerical or symbolic information, e.g., in the form of decisions. Computer vision seeks to duplicate the abilities of human vision by electronically perceiving and understanding an image. Understanding in this context means the transformation of visual images (the input of the retina) into descriptions of the world that can interface with other thought processes and elicit appropriate action. This image understanding can be seen as the disentangling of symbolic information from image data using models constructed with the aid of geometry, physics, statistics, and learning theory. Computer vision has also been described as the enterprise of automating and integrating a wide range of processes and representations for vision perception. As a scientific discipline, computer vision is concerned with the theory behind artificial systems that extract information from images. The image data can take many forms, such as video sequences, views from multiple cameras, or multi-dimensional data from a scanner.

One aspect of computer vision comprises determining whether or not the image data contains some specific object, feature, or activity. Different varieties of computer vision recognition include: Object Recognition (also called object classification)—One or several pre-specified or learned objects or object classes can be recognized, usually together with their 2D positions in the image or 3D poses in the scene. Identification—An individual instance of an object is recognized. Examples include identification of a specific person's face or fingerprint, identification of handwritten digits, or identification of a specific vehicle. Detection—The image data are scanned for a specific condition. Examples include detection of possible abnormal cells or tissues in medical images or detection of a vehicle in an automatic road toll system. Detection based on relatively simple and fast computations is sometimes used for finding smaller regions of interesting image data that can be further analyzed by more computationally demanding techniques to produce a correct interpretation.

The processes associated with computer vision techniques may include image acquisition, pre-processing feature extraction, detection/segmentation, high-level processing, and decision making, each of which will be described below.

Image acquisition—A digital image is produced by one or several image sensors, which, besides various types of light-sensitive cameras, may include range sensors, tomography devices, radar, ultra-sonic cameras, satellite cameras, etc. Depending on the type of sensor, the resulting image data may be a 2D image, a 3D volume, or an image sequence. The pixel values may correspond to light intensity in one or several spectral bands (gray images or color images), but can also be related to various physical measures, such as depth, absorption or reflectance of sonic or electromagnetic waves, or nuclear magnetic resonance.

Pre-processing—Before a computer vision method can be applied to image data in order to extract some specific piece of information, it is usually beneficial to process the data in order to assure that it satisfies certain assumptions implied by the method. Examples of pre-processing include, but are not limited to, re-sampling in order to assure that the image coordinate system is correct, noise reduction in order to assure that sensor noise does not introduce false information, contrast enhancement to assure that relevant information can be detected, and scale space representation to enhance image structures at locally appropriate scales.

Feature extraction—Image features at various levels of complexity are extracted from the image data. Typical examples of such features are: Lines, edges, and ridges; Localized interest points such as corners, blobs, or points; More complex features may be related to texture, shape, and/or motion.

Detection/segmentation—At some point in the processing a decision may be made about which image points or regions of the image are relevant for further processing. Examples are: Selection of a specific set of interest points; Segmentation of one or multiple image regions that contain a specific object of interest; Segmentation of the image into nested scene architecture comprising foreground, object groups, single objects, or salient object parts (also referred to as spatial-taxon scene hierarchy).

High-level processing—At this step, the input may be a small set of data, for example a set of points or an image region that is assumed to contain a specific object. The remaining processing may comprise, for example: Verification that the data satisfy model-based and application-specific assumptions; Estimation of application-specific parameters, such as object pose or object size; Image recognition—classifying a detected object into different categories; Image registration—comparing and combining two different views of the same object.

Decision making—Making the final decision required for the application, for example match/no-match in recognition applications.

One or more of the present embodiments may include a vision processing unit (not shown separately, but may be a component of the CVM). A vision processing unit is an emerging class of microprocessor; it is a specific type of AI (artificial intelligence) accelerator designed to accelerate machine vision tasks. Vision processing units are distinct from video processing units (which are specialized for video encoding and decoding) in their suitability for running machine vision algorithms such as convolutional neural networks, SIFT, etc. Vision processing units may include direct interfaces to take data from cameras (bypassing any off-chip buffers), and may have a greater emphasis on on-chip data flow between many parallel execution units with scratchpad memory, like a many core DSP (digital signal processor). But, like video processing units, vision processing units may have a focus on low precision fixed-point arithmetic for image processing.

The result of the segmentation component 126 as described above may include the generation of the object representations 152(*a*)-(*d*) and identification of the object representation 152(*a*) that corresponds to the building depicted in the image 150. These object representations 152(*a*)-(*d*) may be assigned coordinates in a grid-based coordinate system as discussed herein. For example, the grid-based coordinate system may include coordinates in two or more dimensions and the coordinate system may be generated to represent a to-scale representation of the object representations 152(*a*)-(*d*).

The object representation 152(*a*) may then be utilized, such as by the floor-plan generator 128 of the system 104, to generate a floor plan 154 of the building. For example, the object representation 152(*a*) may be utilized to generate floor-plan data indicating the exterior shape of the building and including exterior walls. Additionally, when a sidewalk is tagged in the image data, that information may be utilized to determine a location of one or more doors to the building. Representations of these doors may be included in the floor-plan data and may show an approximate location of the doors with respect to the exterior walls. Additionally, when a driveway, deck or equivalent, or grass area is tagged in the image data, that information may be utilized to determine potential flat areas associated with the building. Those flat areas may be utilized for delivery of items, such as items purchased in an online marketplace, to the building. Additionally, the image data and/or other data associated with the building, may be utilized to determine a number of levels of the building and/or outlines of the levels. For example, a side view image of the building may be utilized to determine if the building is a single-level building or multi-level building. Other information such as the square footage of the building, a description of the number of rooms and/or types of rooms of the building, and/or naming indicators associated with the devices associated with the building may be utilized to determine building levels. For example, when the square footage of the building is approximately twice the amount of the area of the generated floor plan 154, this information may indicate that the building has two roughly equal levels. In other examples, data indicating that the building contains many bedrooms and/or bathrooms, a basement, a loft, etc. may indicate that the building is a multi-level building. In other examples, device naming indicators such as "basement light," "main floor lights," and/or "upstairs lights" may indicate that the building includes multiple levels. Some or all of this information may be utilized by the floor-plan generator 128 to generate the floor plans 154 described herein.

When a floor plan is generated as described herein, representations of the exterior walls of the building may be assigned coordinates in the coordinate system. These coordinates may be utilized by the system to determine where the exterior walls are with respect to each other and with respect to objects associated with the building. Likewise, the device and object representations may also be assigned coordinates to indicate where in the coordinate system those representations should be located. The device-associated data described herein, such as device-affinity data, signal-strength data, selection data, and/or acoustic region data may be utilized to determine physical distances between devices and/or to determine sections of the floor plan that should include the devices. This information may be utilized to determine which coordinates of the coordinate system should be assigned to the device representations. It should be understood that while a grid-based coordinate system is utilized herein, one or more other systems to represent the spatial relationship between objects and/or devices may be utilized.

Additionally, if images of the interior of the building have been made publicly available and the user has provided consent to the use of such images generally and/or for the purposes described in this disclosure, corresponding image data may be utilized to determine the presence and location of interior walls of the building. In these examples, representations of these interior walls may be included in the floor plan 154. In other examples where such image data is not available and/or consent to utilize such data is not available or has not been provided, a user interface 122 may be generated by the user-interface generator 132 with functionality that allows for a user to add interior walls to the floor plan. For example, the user-interface generator 132 may generate a user interface 122 that includes a visual representation of the floor plan 154. The user interface 122 may also include a library of objects that may be added to the floor plan 154, such as by touch input on the user device 102 displaying the user interface 122. In these examples, the object library may include a "wall" icon that, when selected, may allow a user to provide input to the user device 102 indicating where one or more walls are located with respect to the floor plan 154. The user interface 122 may be configured to allow the user to manipulate the size and position of the walls. Additional icons such as a "door" icon and/or a "window" icon may be caused to be displayed on the user interface 122 and may be utilized by the user to place and/or size doors and windows, respectively. The user may also utilize the user interface 122 to correct and/or change the sizing and/or placement of the exterior walls and/or interior walls as determined by the floor-plan generator 128. It should be understood that while the sizing and placement of item representations is described herein with respect to example objects such as walls, doors, and windows, the object library may contain these and/or other object icons associated with any number of objects associated with a building. It should also be understood that while several of the examples herein are associated with a home, the building may include any structure that may include electronic devices. The representations of window and doors may be assigned coordinates based on their relative location with respect to coordinates corresponding to the exterior walls of the building.

The system 104 may also be configured to place and/or enable placement of visual representations 156 of devices with respect to the floor plan 154. For example, the object library may include one or more visual representations 156 of the devices associated with the building. In these examples, the user-interface generator 132 may query the user registry 138 to determine which devices are associated with the building. By way of example, a voice-enabled device may be disposed within the building and that voice-enabled device may be associated with account data indicating the address of the building, user identifier data, one or more other voice-enabled devices associated with the building, and/or one or more connected devices associated with the voice-enabled device(s). Visual representations 156 of these devices may be generated and may be included in the object library. The visual representations 156 may include icons of the devices, which may be generic device icons and/or may be based at least in part on the device type of a given device, and/or text showing a naming indicator for the device. The naming indicator may correspond to a device name provided by a user and/or a device name provided by a smart-device system associated with the device and/or a device name determined by the system 104. In these examples, the user interface 122 may be configured to allow the user to select the device representations 156 from the device library to the floor plan representation. By doing so, the user may provide input on the placement of the devices within the building and/or the rooms of the building. The user interface 122 may also allow the user to change the name of a given device, change the icon, and/or provide an indication of the device type. The user may also provide an indication when a device disposed within the building is not included in the library. Such input may cause one or more of the voice-enabled devices and/or the system 104 to initiate a device discovery process to identify the missing device(s) and include a representation of the device(s) in the user interface 122.

In other examples, data associated with the floor plan 154 and/or the devices may be utilized to automatically place the visual representations 156 of the devices on the floor plan 154. For example, the user interface 122 may allow a user to label one or more rooms of the floor plan 154, such as labelling the rooms as "kitchen," "family room," office," "dining room," "hallway," etc. When room labels 158 such as these are provided, the user-interface generator 132 may utilize the naming indicators of the devices to determine where device representations 156 should be placed. For example, the devices may include devices with the naming indicators of "Kitchen Light 1," "Kitchen Light 2," "Family Room Speaker 1," and "Family Room Speaker 2." In these examples where room labels 158 have been identified, the device representations 156 associated with such room labels 158 may be placed in their respective rooms. For example, if a room of the floor plan 154 is labeled "Kitchen," the device representations 156 associated with device naming indicators that include "kitchen" or similar words may be placed on the portion of the floor plan 154 corresponding to the kitchen.

Alternatively, when room labels 158 have not been provided but device naming indicators are known, the device naming indicators may be utilized to generate room labels 158 and place devices. Utilizing the example provided above, a user may provide input such as moving the device representation for "Kitchen Light 1" from the object library to a representation of a room of the floor plan 154. The system 104 may receive input data corresponding to that input and may utilize the input data to generate a "Kitchen" room label 158 for the room in question. The system 104 may also determine which other devices have naming indicators that include "kitchen" or a similar word and may place corresponding device representations 154(a)-(b) in the "Kitchen" portion of the floor plan 154. Additionally, in examples where the account data indicates groupings of devices, those groupings may be utilized to inform which devices are to be associated with which room labels 158.

Additionally, or alternatively, the system 104 may utilize signal-strength data and/or device-affinity data to determine placement of device representations 156 with respect to the floor plan 154. For example, as the devices are utilized, usage data associated with the devices may be generated and stored in the data stores 140. That usage data may include device-affinity data indicating which connected devices communicate with which voice-enabled devices most frequently. The usage data may also include signal-strength data indicating a signal strength, such as for communication signals sent between devices utilizing one or more communication protocols. Stronger signal strength may indicate that the two devices are physically closer to each other than two devices having lower signal strength. Additionally, with respect to the voice-enabled devices, the voice-enabled devices may include multiple microphones for capturing audio. The microphones may be arranged in an array and may be configured to each receive audio from the environment and generate audio data corresponding to the audio. The audio data may be analyzed to determine the direction of the source of the audio with respect to the microphones. This information, as well as acoustic echo information for example, may be utilized by the voice-enabled devices to determine a location of the voice-enabled devices within a given room.

The data described herein, such as device-affinity data, signal-strength data, selection data, and/or acoustic region data may be utilized to determine physical distances between devices and/or to determine sections of the floor plan that should include the devices. This information may be utilized to determine which coordinates of the coordinate system should be assigned to the device representations. It should be understood that while a grid-based coordinate system is utilized herein, one or more other systems to represent the spatial relationship between objects and/or devices may be utilized. In examples, a mapping or other association between the device-associated data and the coordinate system may be generated and/or utilized to determine which coordinates to assign to a given device representation. For example, signal-strength data may be mapped or otherwise utilized to a distance as represented by the coordinate system. By way of additional example, selection data and/or acoustic region data, and/or audio data may be mapped or otherwise utilized to a distance as represented by the coordinate system. In examples, the type of data may be useful to determine how the data may be utilized to determine which coordinates to assign to a given device representation. For example, wireless signals may travel through material, such as walls, while audio data may not and/or may travel through material less than wireless signals. In these examples, the system may utilize the data type to assist in determining spatial relationships between devices and to map those spatial relationships to the coordinate system. Additional details on the generation of at least some of the device-associated data is provided below with respect to FIGS. 12 and 13.

Once the device representations 156 are placed with respect to the floor plan 154, the device-state component 130 may enable functionality that allows for control of the devices utilizing a user device. For example, the user interface 122 may be displayed on the user device 102 and may include the floor plan 154 and the device representations 156. The device representations 156 may be selectable or the user device 102 may otherwise be configured to receive user input to operate the connected devices. For example, the user device 102 may include a touchscreen and the user may touch a portion of a screen of the user device 102 that is displaying a given device representation 156, such as a device representation 156 associated with a light. The user device 102 may generate corresponding input data indicating selection of the device representation 156, which may cause the user device 102 to generate a request to operate the connected device. In other examples, the input data may be sent to a voice-enabled device, the system 104, and/or another device or system, which may generate the request to operate the connected device. The request may be sent to the connected device corresponding to the device representation 156, and the connected device may process the request and perform the indicated operation. In examples, the connected device may send a response indicating that the operation has been performed, and in these examples the user interface 122 may cause display of an indication that the operation has been performed. By way of example, the light device representation may change color, size, emphasis, etc. to indicate that the light has been turned on. In examples, the connected device may be configured to perform multiple functions and/or may have multiple options for performing such functions, such as a dimness of light emission, a light color, etc. In these examples, the user interface 122 may include options associated with such functionality, which may be displayed based at least in part on selection of the device representation. It should be understood that while the state of the device may be received from the connected device at issue, data indicating the state of the device may additionally, or alternatively, be received by the smart-device system and/or the speech-processing system.

The grouping component 134 may be configured to group devices based at least in part on received user input from the user interface 122 and/or based at least in part on the placement of device representations 156 with respect to the floor plan 154. For example, a user may select multiple device representations 156 and/or otherwise indicate selection of such representations, such as by drawing a line around the representations, and may indicate that the selected devices should be grouped. In these examples, a device group may be generated that indicates the device identifiers associated with the selected devices and/or the device group may be given a group naming indicator, such as by the user or as determined based at least in part on the devices at issue and/or the naming indicators of the devices. Additionally, when multiple device representations 156 are placed in a room of the floor plan 154, the corresponding devices may be grouped, and the device group may be associated with a naming indicator corresponding to that room label 158.

The routine component 136 may be configured to determine routines associated with the devices. For example, in addition to device representations, sensor representations may also be included in the user interface 122. Those sensor representations may include, for example, representations of motion sensors, presence sensors such as sensors to determine if a sound source has entered a given room, contact sensors such as those utilized in security equipment, etc. The user interface 122 may be configured to allow a user to select the sensor representations and associate them with one or more of the device representations 156 to create routines. For example, a user may select a motion-sensor representation and may also select or otherwise indicate selection of a light device representation. By so doing, the user may indicate that the user desires to create a routine where the light device corresponding to the light device representation operates when motion is detected by the motion sensor corresponding to the motion sensor representation. In these examples, input data corresponding to the user input may be utilized to determine that a routine is to be generated and the user interface 122 may include functionality to assist in acquiring additional inputs to setup the routine. For example, the user device may be caused to display a "routine setup" window that includes options associated with the routine. The options may be dependent on the connected device being operated and/or the sensor at issue. In the example of a smart light device, the options may include an indication of whether the light should be turned on or off, a brightness level of the light, a color of the light, and/or times of day and/or days of the week that the light should be maintained in the requested state. For example, the user may select the options such that the routine includes turning the light on to a given brightness level and color from 6:00 am to 10:00 pm when motion is detected by the motion sensor at issue. The user device 102 may also be caused to display an indication that the routine has been created and may indicate the existence of the routine on the user interface, such as by utilizing a symbol and/or changing the color, size, and/or format of the device representation(s) associated with the routine.

Additionally, or alternatively, the system 104 may be configured to determine one or more alerts associated with the connected device(s) and cause the user interface 122 to include an indication of such alerts for display on the user device 102. For example, device usage data and/or other data such as weather data, scheduling data, security-system data, presence data, device-state data, etc. may be utilized to determine the typical state of the device(s) and whether, at a given time, the state of a given device differs from the typical state. For example, the device-usage data may indicate that the Kitchen Light 1 device is typically off from 10:00 pm to 5:00 am, but that at 11:00 pm the Kitchen Light 1 device is on. As another example, a contact sensor may indicate that a window of the building is currently open and weather data may indicate a high likelihood of precipitation. In these examples, an alert may be generated and may cause the user interface 122 to include an indication of the alert on the user device 102. The indication may include any indication, such as for example a change in color of the device representation and/or the room associated with the device representation, a textual alert, an audible alert, etc. Upon selection of the alert, the user interface 122 may include functionality for display of an option to take corrective action, such as selectable portions for turning off the light, locking a door, turning off a speaker, etc.

In addition to the above, the placement of device representations 156 in the user interfaces 122 described herein may be utilized to generate location data indicating the locations of the devices with respect to the building and with respect to each other. This data may be utilized by one or more components of the system 104 to assist in performing functions of those components. For example, the location data may be utilized for implicit targeting, such as in situations where a user provides a request such as "turn on the light" but does not explicitly provide a naming indicator for the light. The location data may also be utilized to determine which network access points should be configured to communicate with given connected devices, which voice-enabled devices should be configured to respond to certain user requests, etc.

The user registry component 138 may be configured to identify, determine, and/or generate associations between users, user accounts, and/or devices. For example, one or more associations between user accounts may be identified, determined, and/or generated by the user registry 138. The user registry 138 may additionally store information indicating one or more applications and/or resources accessible to and/or enabled for a given user account. Additionally, the user registry 138 may include information indicating device identifiers, such as naming identifiers, associated with a given user account, as well as device types associated with the device identifiers. The user registry 138 may also include information indicating user account identifiers, naming indicators of devices associated with user accounts, and/or associations between devices, such as the user device 102. The user registry 138 may also include information associated with usage of the connected devices and/or the voice-enabled devices. It should also be understood that a user account may be associated with one or more than one user profiles. It should also be understood that the term "user account" may be used to describe a set of data and/or functionalities associated with a given account identifier. For example, data identified, determined, and/or generated while using some or all of the system 100 may be stored or otherwise associated with an account identifier. Data associated with the user accounts may include, for example, account access information, historical usage data, device-association data, and/or preference data.

As shown in FIG. 1, several of the components of the remote system 104 and the associated functionality of those components as described herein may be performed by the user device 102. Additionally, or alternatively, some or all of the components and/or functionalities associated with the user device 102 may be performed by the remote system 104.

It should be noted that the exchange of data and/or information as described herein, and/or the performance of operations as described herein, may be performed only in situations where a user has provided consent for the exchange of such information and/or performance of such operations. For example, upon setup of devices and/or initiation of applications, a user may be provided with the opportunity to opt in and/or opt out of data exchanges between devices and/or with the polling system and/or for performance of the functionalities described herein. Additionally, when one of the devices is associated with a first user account and another of the devices is associated with a second user account, user consent may be obtained before performing some, any, or all of the operations and/or processes described herein. Additionally, the operations performed by the components of the systems described herein may be performed only in situations where a user has provided consent for performance of the operations.

As used herein, a processor, such as processor(s) 108 and/or the processor(s) described with respect to the components of the remote system 104, may include multiple processors and/or a processor having multiple cores. Further, the processors may comprise one or more cores of different types. For example, the processors may include application processor units, graphic processing units, and so forth. In one implementation, the processor may comprise a microcontroller and/or a microprocessor. The processor(s) 108 and/or the processor(s) described with respect to the components of the remote system 104 may include a graphics processing unit (GPU), a microprocessor, a digital signal processor or other processing units or components known in the art. Alternatively, or in addition, the functionally described herein can be performed, at least in part, by one or more hardware logic components. For example, and without limitation, illustrative types of hardware logic components that can be used include field-programmable gate arrays (FPGAs), application-specific integrated circuits (ASICs), application-specific standard products (ASSPs), system-on-a-chip systems (SOCs), complex programmable logic devices (CPLDs), etc. Additionally, each of the processor(s) 108 and/or the processor(s) described with respect to the components of the remote system 104 may possess its own local memory, which also may store program components, program data, and/or one or more operating systems.

The memory 112 and/or the memory described with respect to the components of the remote system 104 may include volatile and nonvolatile memory, removable and non-removable media implemented in any method or technology for storage of information, such as computer-readable instructions, data structures, program component, or other data. Such memory 112 and/or the memory described with respect to the components of the remote system 104 includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, RAID storage systems, or any other medium which can be used to store the desired information and which can be accessed by a computing device. The memory 112 and/or the memory described with respect to the components of the remote system 104 may be implemented as computer-readable storage media ("CRSM"), which may be any available physical media accessible by the processor(s) 108 and/or the processor(s) described with respect to the remote system 104 to execute instructions stored on the memory 112 and/or the memory described with respect to the components of the remote system 104. In one basic implementation, CRSM may include random access memory ("RAM") and Flash memory. In other implementations, CRSM may include, but is not limited to, read-only memory ("ROM"), electrically erasable programmable read-only memory ("EEPROM"), or any other tangible medium which can be used to store the desired information and which can be accessed by the processor(s).

Further, functional components may be stored in the respective memories, or the same functionality may alternatively be implemented in hardware, firmware, application specific integrated circuits, field programmable gate arrays, or as a system on a chip (SoC). In addition, while not illustrated, each respective memory, such as memory 112 and/or the memory described with respect to the components of the remote system 104, discussed herein may include at least one operating system (OS) component that is configured to manage hardware resource devices such as the network interface(s), the I/O devices of the respective apparatuses, and so forth, and provide various services to applications or components executing on the processors. Such OS component may implement a variant of the FreeBSD operating system as promulgated by the FreeBSD Project; other UNIX or UNIX-like variants; a variation of the Linux operating system as promulgated by Linus Torvalds; the FireOS operating system from Amazon.com Inc. of Seattle, Wash., USA; the Windows operating system from Microsoft Corporation of Redmond, Wash., USA; LynxOS as promulgated by Lynx Software Technologies, Inc. of San Jose, Calif.; Operating System Embedded (Enea OSE) as promulgated by ENEA AB of Sweden; and so forth.

The network interface(s) 110 and/or the network interface(s) described with respect to the components of the remote system 104 may enable messages between the components and/or devices shown in system 100 and/or with one or more other polling systems, as well as other networked devices. Such network interface(s) 110 and/or the network interface(s) described with respect to the components of the remote system 104 may include one or more network interface controllers (NICs) or other types of transceiver devices to send and receive messages over the network 108.

For instance, each of the network interface(s) 110 and/or the network interface(s) described with respect to the components of the remote system 104 may include a personal area network (PAN) component to enable messages over one or more short-range wireless message channels. For instance, the PAN component may enable messages compliant with at least one of the following standards IEEE 802.15.4 (ZigBee®), IEEE 802.15.1 (Bluetooth®), IEEE 802.11 (WiFi™), or any other PAN message protocol. Furthermore, each of the network interface(s) 110 and/or the network interface(s) described with respect to the components of the remote system 104 may include a wide area network (WAN) component to enable message over a wide area network.

In some instances, the remote system 104 may be local to an environment associated the user devices 102. For instance, the remote system 104 may be located within one or more of the user devices 102. In some instances, some or all of the functionality of the remote system 104 may be performed by one or more of the user devices 102. Also, while various components of the remote system 104 have been labeled and named in this disclosure and each component has been described as being configured to cause the processor(s) to perform certain operations, it should be understood that the described operations may be performed by some or all of the components and/or other components not specifically illustrated.

Figure 2:
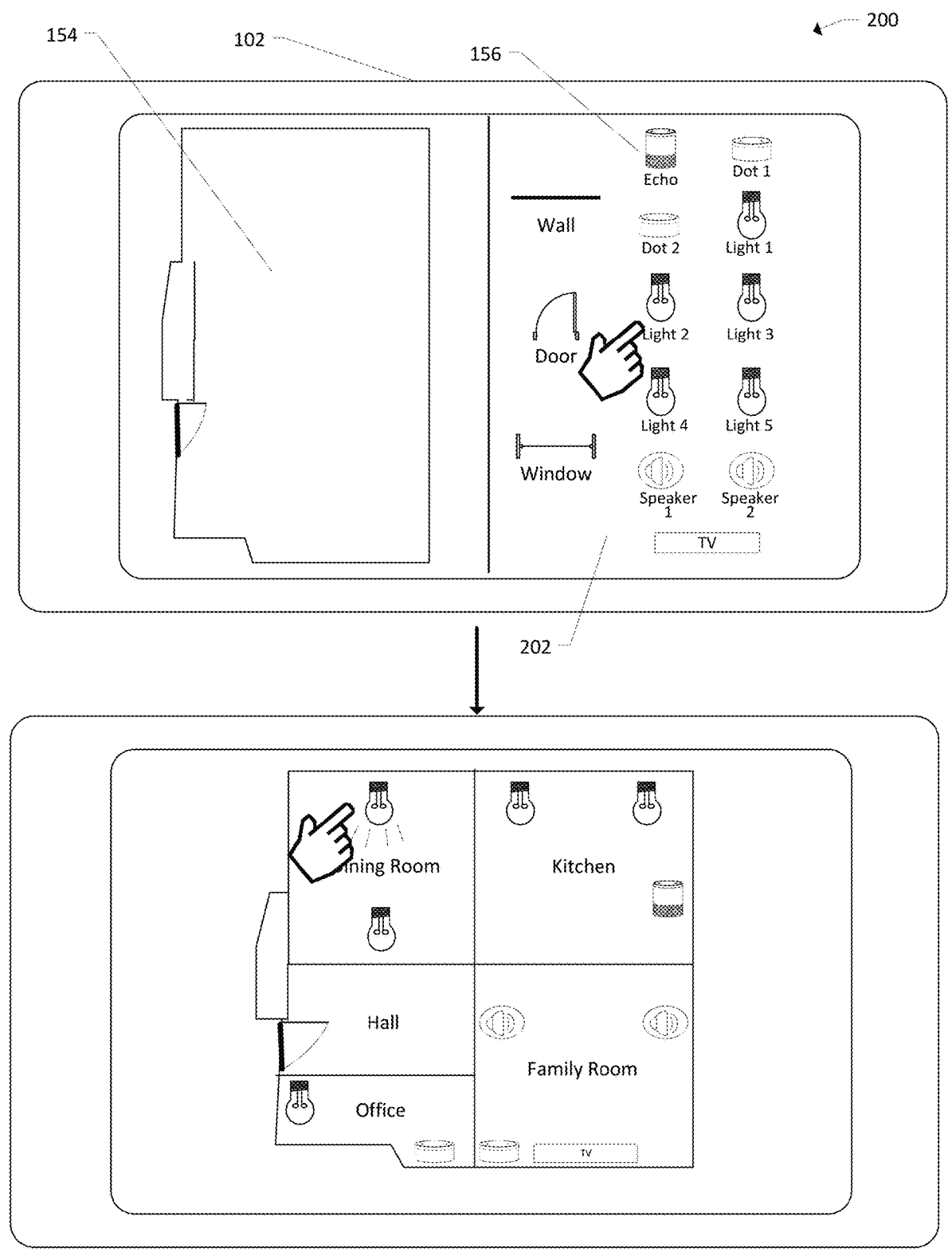
FIG. 2 illustrates an example user interface for user placement of device representations on a floor plan.

FIG. 2 illustrates an example user interface 200 for placement of device representations 156 on a floor plan 154. The user interface 200 may be the same as or similar to the user interfaces 122 described with respect to FIG. 1. FIG. 2 depicts changes to the user interface from top to bottom. The user interface 200 may include the same or similar components as described with respect to FIG. 1. For example, the user interface 200 may include a floor plan 154 and device representations 156. The user interface 200 may also include an object library 202. The user interface 200 may be utilized to allow a user to size and/or place device representations 156 and/or other object representations, such as walls, on the floor plan 154.

For example, the object library 202 may include one or more visual representations 156 of the devices associated with the building. In these examples, a user-interface generator may query a user registry to determine which devices are associated with the building. By way of example, a voice-enabled device may be disposed within the building and that voice-enabled device may be associated with account data indicating the address of the building, user identifier data, one or more other voice-enabled devices associated with the building, and/or one or more connected devices associated with the voice-enabled device(s). Visual representations 156 of these devices may be generated and may be included in the object library. The visual representations 156 may include icons of the devices, which may be generic device icons and/or may be based at least in part on the device type of a given device, and/or text showing a naming indicator for the device. The naming indicator may correspond to a device name provided by a user and/or a device name provided by a smart-device system associated with the device and/or a device name determined by a system associated with the voice-enabled devices.

In these examples, the user interface 200 may be configured to allow the user to select and move the device representations 156 from the object library 202 to the floor plan representation. By doing so, the user may provide input on the placement of the devices within the building and/or the rooms of the building. The user interface 202 may also allow the user to change the name of a given device, change the icon, and/or provide an indication of the device type. The user may also provide an indication when a device disposed within the building is not included in the library. Such input may cause one or more of the voice-enabled devices and/or the system to initiate a device discovery process to identify the missing device(s) and include a representation of the device(s) in the user interface 202.

Additionally, or alternatively, the system may utilize signal-strength data and/or device-affinity data to determine placement of device representations 156 with respect to the floor plan 154. For example, as the devices are utilized, usage data associated with the devices may be generated and stored in data stores 140. That usage data may include device-affinity data indicating which connected devices communicate with which voice-enabled devices most frequently. The usage data may also include signal-strength data indicating a signal strength, such as for communication signals sent between devices utilizing one or more communication protocols. Stronger signal strength may indicate that the two devices are physically closer to each other than two devices having lower signal strength. Additionally, with respect to the voice-enabled devices, the voice-enabled devices may include multiple microphones for capturing audio. The microphones may be arranged in an array and may be configured to each receive audio from the environment and generate audio data corresponding to the audio. The audio data may be analyzed to determine the direction of the source of the audio with respect to the microphones. This information, as well as acoustic echo information for example, may be utilized by the voice-enabled devices to determine a location of the voice-enabled devices within a given room. Once the device representations are placed, such as in the coordinate system, with respect to the floor plan, the representations may be selectable to cause operation of the devices themselves.

Figure 3:
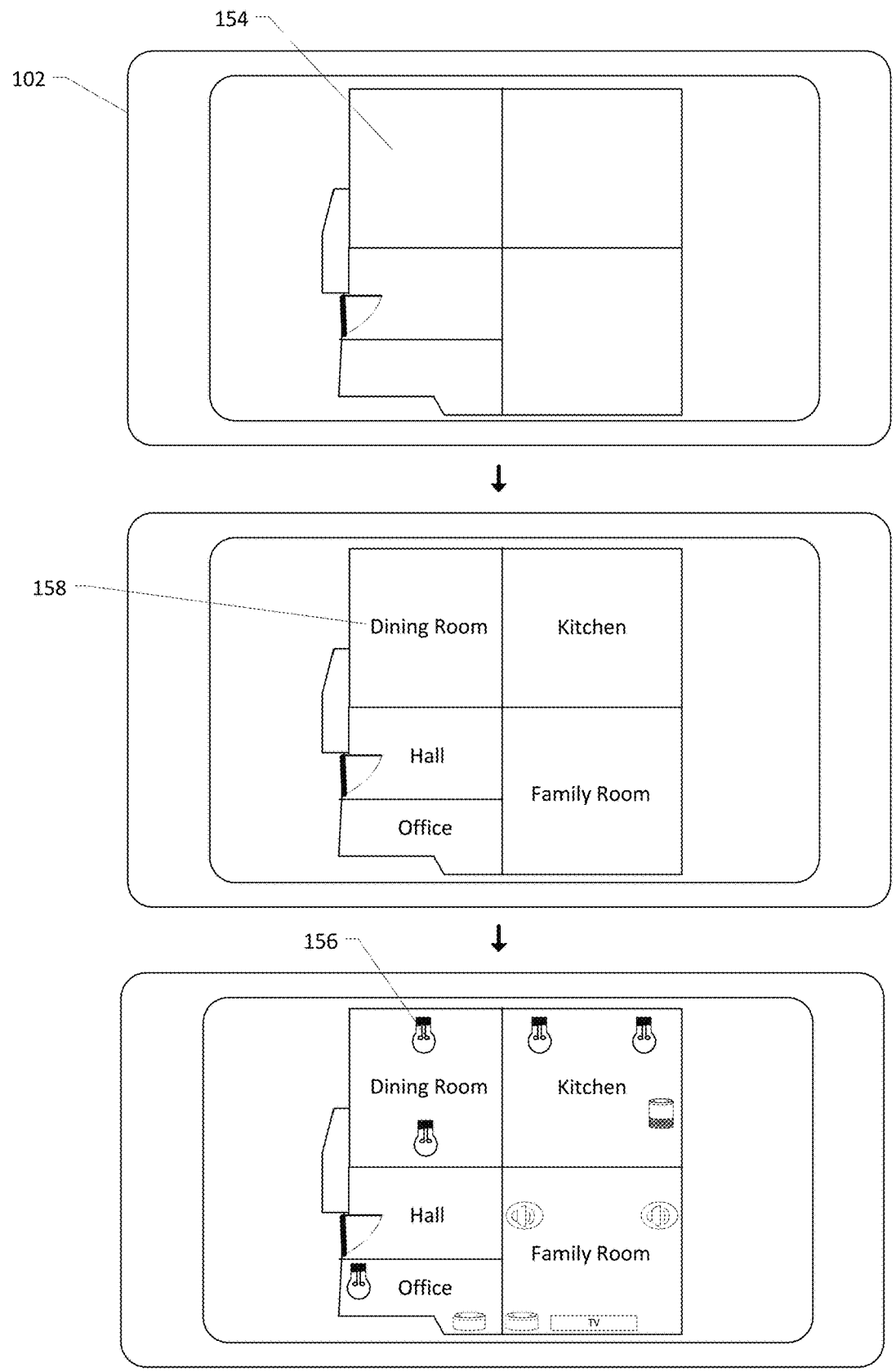
FIG. 3 illustrates an example user interface for placement of device representations utilizing room names.

FIG. 3 illustrates an example user interface 300 for placement of device representations 156 utilizing room names. The user interface 300 may be the same as or similar to the user interfaces 122 described with respect to FIG. 1. FIG. 3 depicts changes to the user interface from top to bottom. The user interface 300 may include the same or similar components as described with respect to FIG. 1. For example, the user interface 300 may include a floor plan 154 and device representations 156. The user interface 300 may be utilized to allow a user to provide room labels 158 and automatically place device representations 156 based at least in part on the room labels 158.

For example, data associated with the floor plan 154 and/or the devices may be utilized to automatically place the visual representations 156 of the devices on the floor plan 154. For example, the user interface 300 may allow a user to label one or more rooms of the floor plan 154, such as labelling the rooms as "kitchen," "family room," office," "dining room," "hallway," etc. When room labels 158 such as these are provided, a user-interface generator may utilize the naming indicators of the devices to determine where device representations 156 should be placed. For example, the devices may include devices with the naming indicators of "Kitchen Light 1," "Kitchen Light 2," "Family Room Speaker 1," and "Family Room Speaker 2." In these examples where room labels 158 have been identified, the device representations 156 associated with such room labels 158 may be placed in their respective rooms. For example, if a room of the floor plan 154 is labeled "Kitchen," the device representations 156 associated with device naming indicators that include "kitchen" or similar words may be placed on the portion of the floor plan 154 corresponding to the kitchen.

Figure 4:
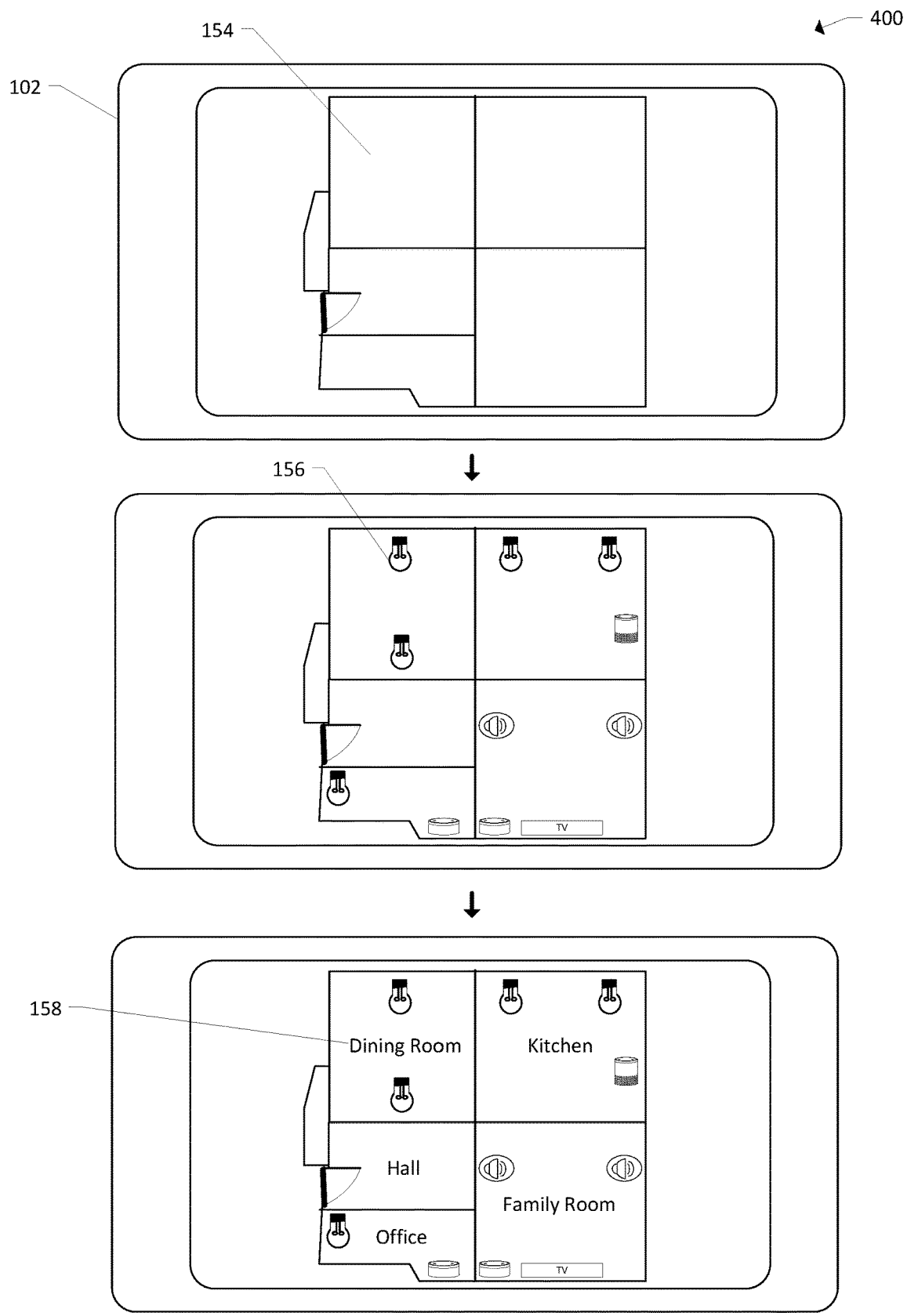
FIG. 4 illustrates an example user interface for naming rooms of a floor plan based on placement of device representations.

FIG. 4 illustrates an example user interface 400 for naming rooms of a floor plan 154 based on placement of device representations 156. The user interface 400 may be the same as or similar to the user interfaces 122 described with respect to FIG. 1. FIG. 4 depicts changes to the user interface from top to bottom. The user interface 400 may include the same or similar components as described with respect to FIG. 1. For example, the user interface 400 may include a floor plan 154 and device representations 156. The user interface 400 may be utilized to allow a user provide room labels 158 and automatically label rooms when device representations 156 have been placed with respect to the floor plan 154.

For example, when room labels 158 have not been provided but device naming indicators are known, the device naming indicators may be utilized to generate room labels 158 and place devices. Utilizing the example provided elsewhere herein, a user may provide input such as moving the device representation for "Kitchen Light 1" from the object library 202 to a representation of a room of the floor plan 154. The system 104 may receive input data corresponding to that input and may utilize the input data to generate a "Kitchen" room label 158 for the room in question. The system may also determine which other devices have naming indicators that include "kitchen" or a similar word and may place corresponding device representations 156 in the "Kitchen" portion of the floor plan 154. Additionally, in examples where the account data indicates groupings of devices, those groupings may be utilized to inform which devices are to be associated with which room labels 158.

Figure 5:
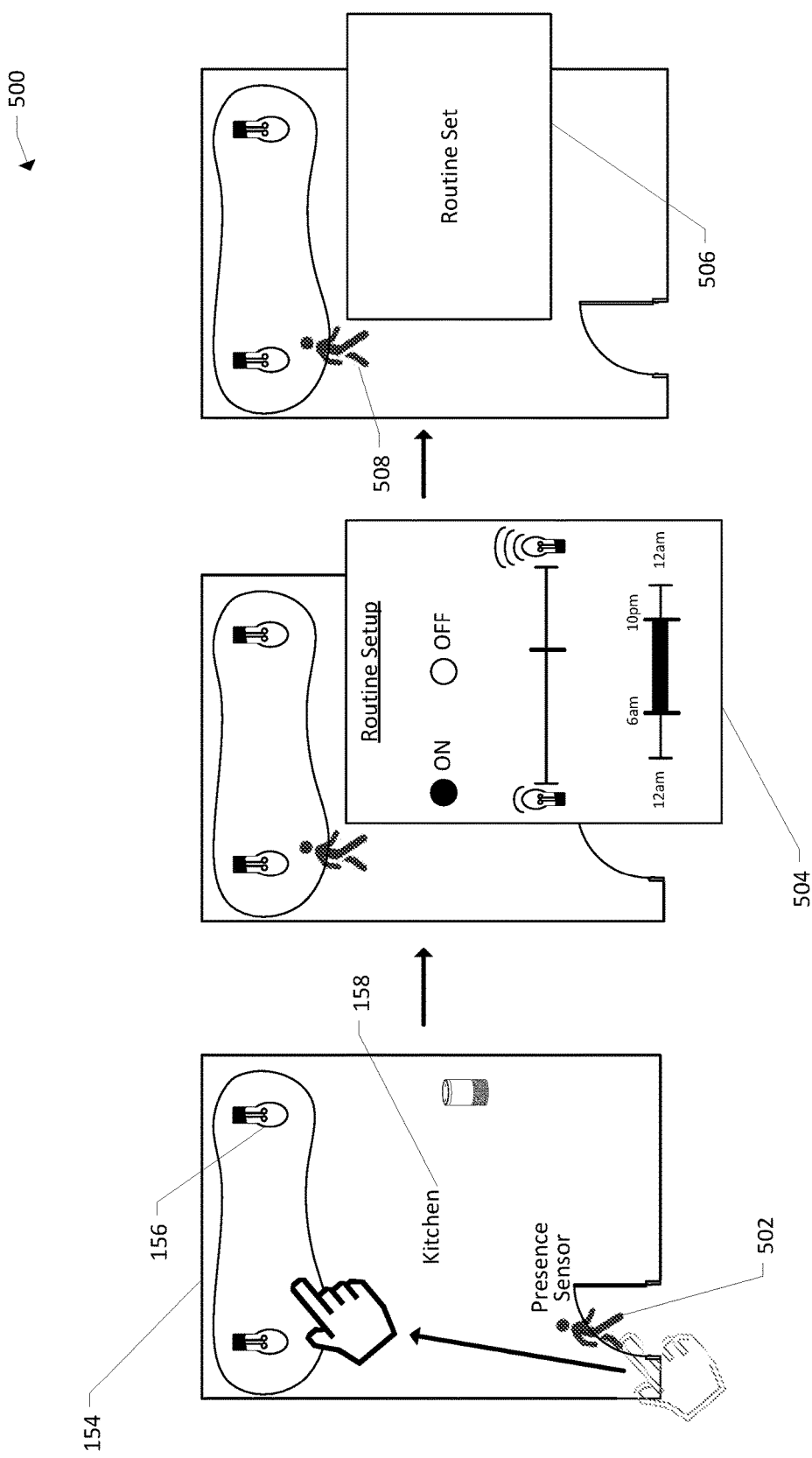
FIG. 5 illustrates an example user interface for setting routines utilizing generated floor plans.

FIG. 5 illustrates an example user interface 500 for setting routines utilizing generated floor plans 154. The user interface 500 may be the same as or similar to the user interfaces 122 described with respect to FIG. 1. FIG. 5 depicts changes to the user interface 500 from left to right. The user interface 500 may include the same or similar components as described with respect to FIG. 1. For example, the user interface 500 may include a floor plan 154, device representations 156, and room labels 158. The user interface 500 may be utilized to set routines associated with the connected devices.

For example, in addition to device representations 156, sensor representations 502 may also be included in the user interface 500. Those sensor representations 502 may include, for example, representations of motion sensors, presence sensors such as sensors to determine if a sound source has entered a given room, contact sensors such as those utilized in security equipment, etc. The user interface 500 may be configured to allow a user to select the sensor representations 502 and associate them with one or more of the device representations 156 to create routines. For example, a user may select a motion-sensor representation 502 and may also select or otherwise indicate selection of a light device representation 156. By so doing, the user may indicate that the user desires to create a routine where the light device corresponding to the light device representation 156 operates when motion is detected by the motion sensor corresponding to the motion sensor representation 502. In these examples, input data corresponding to the user input may be utilized to determine that a routine is to be generated and the user interface 500 may include functionality to assist in acquiring additional inputs to setup the routine. For example, the user device 102 may be caused to display a "routine setup" window 504 that includes options associated with the routine. The options may be dependent on the connected device being operated and/or the sensor at issue.

In the example of a smart light device, the options may include an indication of whether the light should be turned on or off, a brightness level of the light, a color of the light, and/or times of day and/or days of the week that the light should be maintained in the requested state. For example, the user may select the options such that the routine includes turning the light on to a given brightness level and color from 6:00 am to 10:00 pm when motion is detected by the motion sensor at issue. The user device 102 may also be caused to display an indication 506 that the routine has been created and may indicate the existence of the routine on the user interface, such as by utilizing a symbol 508 and/or changing the color, size, and/or format of the device representation(s) 156 associated with the routine.

It should be understood that while sensors are described herein as devices used for triggering events in a routine, any devices and/or events may be utilized. For example, when a device is turned on, the event of turning on the device may act as a triggering event for a routine to occur. In other examples, the occurrence of a time-based event may act as a triggering event for a routine to occur.

Figure 6:
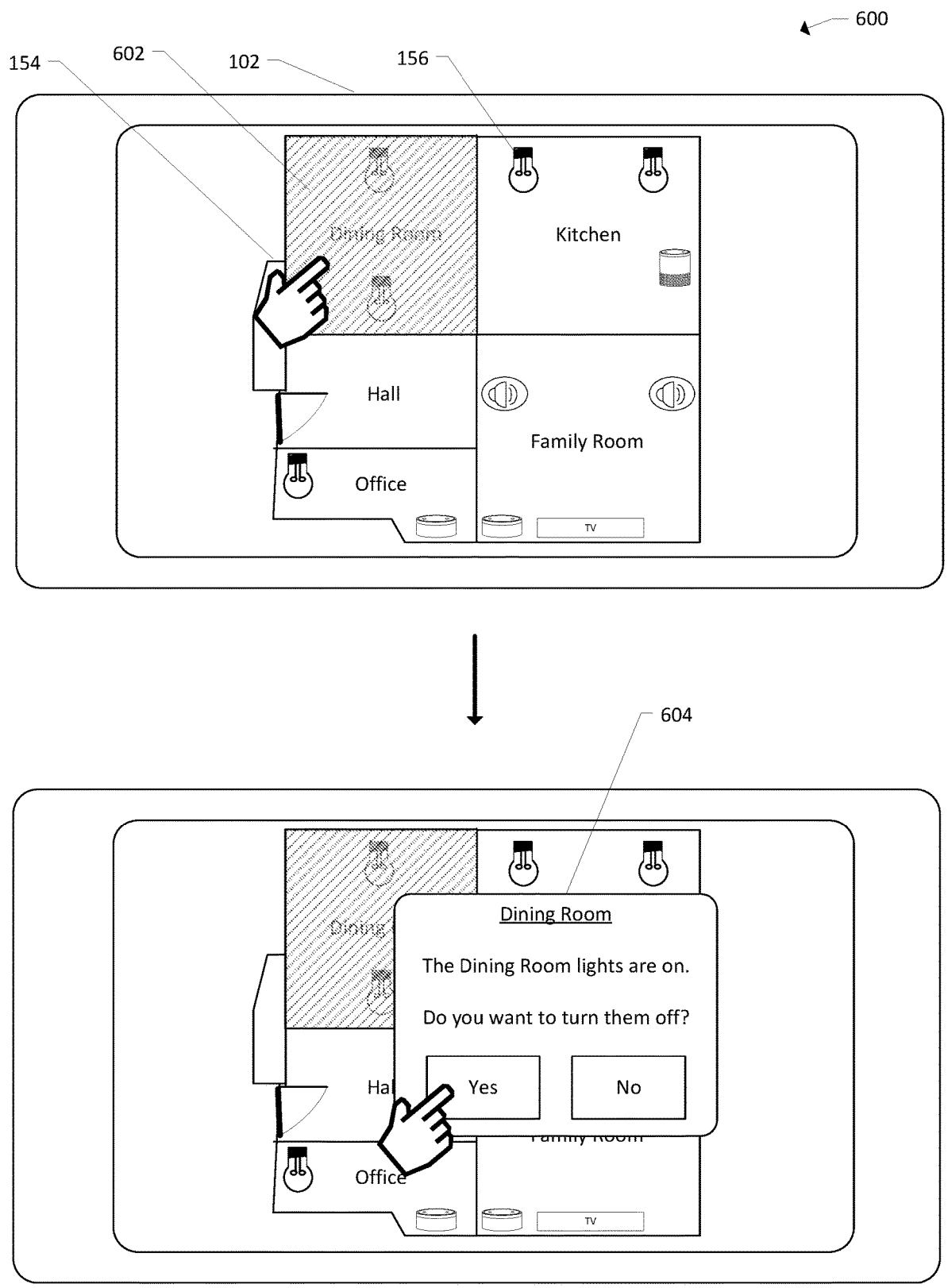
FIG. 6 illustrates an example user interface for displaying alerts associated with devices.

FIG. 6 illustrates an example user interface 600 for displaying alerts associated with devices. The user interface 600 may be the same as or similar to the user interfaces 122 described with respect to FIG. 1. FIG. 6 depicts changes to the user interface 600 from top to bottom. The user interface 600 may include the same or similar components as described with respect to FIG. 1. For example, the user interface 600 may include a floor plan 154, device representations 156, and room labels 158. The user interface 600 may be utilized display alerts associated with the connected devices.

For example, device usage data and/or other data such as weather data, scheduling data, security-system data, presence data, device-state data, etc. may be utilized to determine the typical state of the device(s) and whether, at a given time, the state of a given device differs from the typical state. For example, the device-usage data may indicate that the Kitchen Light 1 device is typically off from 10:00 pm to 5:00 am, but that at 11:00 pm the Kitchen Light 1 device is on. As another example, a contact sensor may indicate that a window of the building is currently open and weather data may indicate a high likelihood of precipitation. In these examples, an alert may be generated and may cause the user interface to include an alert indication 602 on the user device 102. The alert indication 602 may include any indication, such as for example a change in color of the device representation 156 and/or the room associated with the device representation 156, a textual alert, an audible alert, etc. Upon selection of the alert, the user interface 600 may include functionality for display an explanation screen 604 providing additional details about the alert. The explanation screen 604 may include an option to take corrective action, such as selectable portions for turning off the light, locking a door, turning off a speaker, etc.

In addition to the above, the placement of device representations 156 in the user interfaces 200-600 described herein may be utilized to generate location data indicating the locations of the devices with respect to the building and with respect to each other. This data may be utilized by one or more components of the system 104 to assist in performing functions of those components. For example, the location data may be utilized for implicit targeting, such as in situations where a user provides a request such as "turn on the light" but does not explicitly provide a naming indicator for the light. The location data may also be utilized to determine which network access points should be configured to communicate with given connected devices, which voice-enabled devices should be configured to respond to certain user requests, etc.

Figure 7:
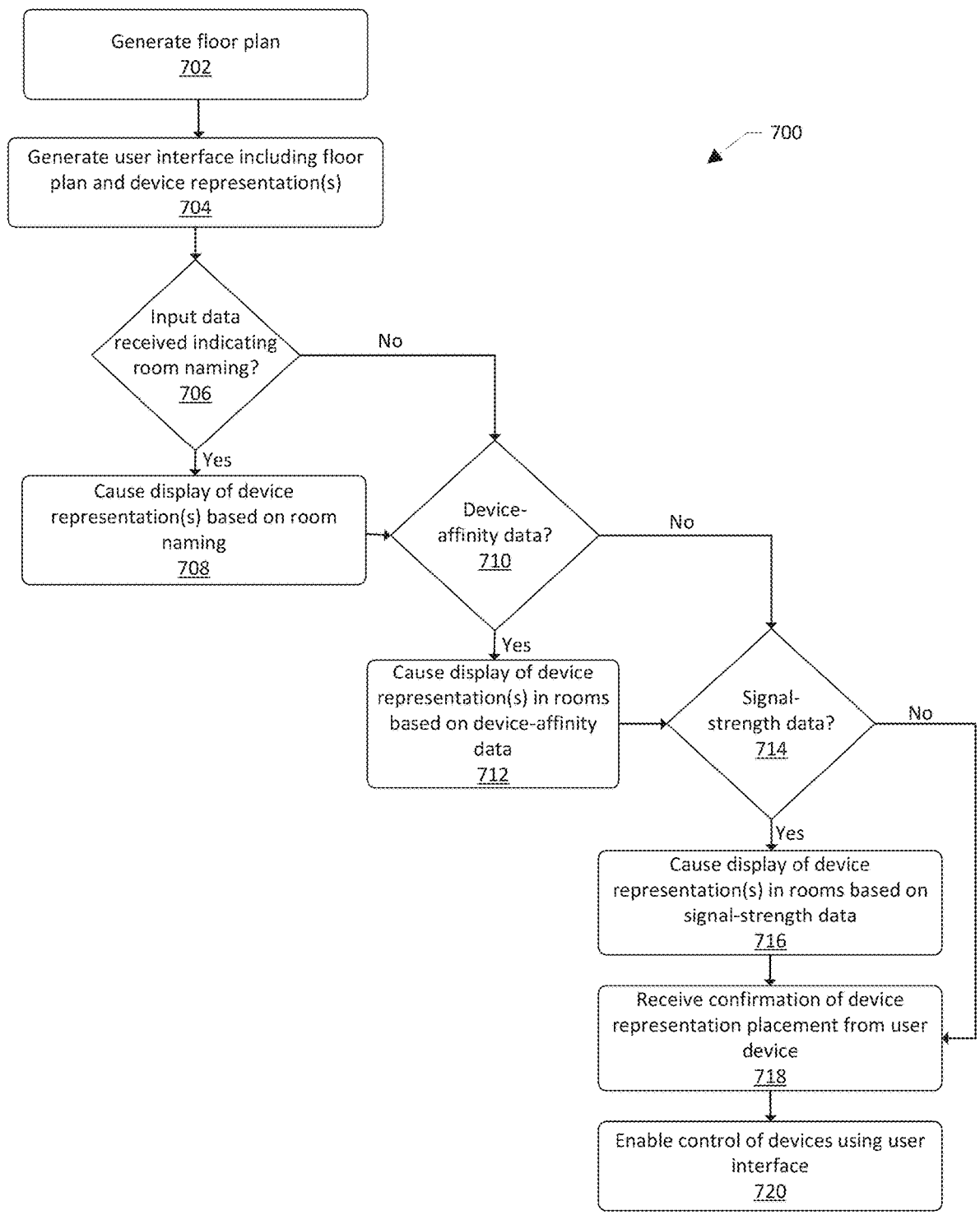
FIG. 7 illustrates a flow diagram of an example process for floor plan generation for device visualization and use.
Figure 8:
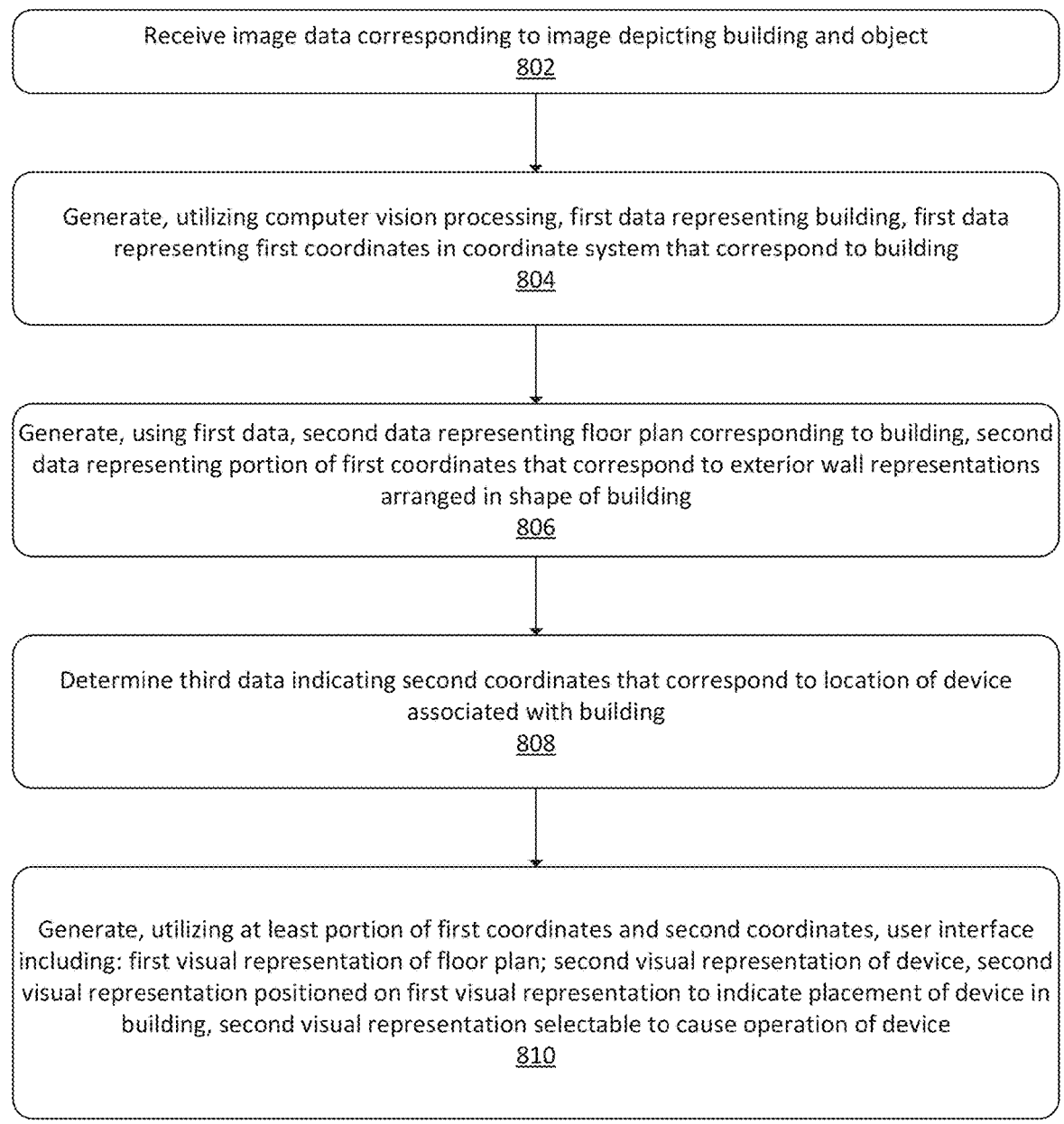
FIG. 8 illustrates a flow diagram of another example process for floor plan generation for device visualization and use.

FIGS. 7-9 illustrates processes for generating floor plans for device visualization and control. The processes described herein are illustrated as collections of blocks in logical flow diagrams, which represent a sequence of operations, some or all of which may be implemented in hardware, software or a combination thereof. In the context of software, the blocks may represent computer-executable instructions stored on one or more computer-readable media that, when executed by one or more processors, program the processors to perform the recited operations. Generally, computer-executable instructions include routines, programs, objects, components, data structures and the like that perform particular functions or implement particular data types. The order in which the blocks are described should not be construed as a limitation, unless specifically noted. Any number of the described blocks may be combined in any order and/or in parallel to implement the process, or alternative processes, and not all of the blocks need be executed. For discussion purposes, the processes are described with reference to the environments, architectures and systems described in the examples herein, such as, for example those described with respect to FIGS. 1-6 and 10, although the processes may be implemented in a wide variety of other environments, architectures and systems.

FIG. 7 illustrates a flow diagram of an example process 700 for floor plan generation for device visualization and use. The order in which the operations or steps are described is not intended to be construed as a limitation, and any number of the described operations may be combined in any order and/or in parallel to implement process 700.

At block 702, the process 700 may include generating a floor plan. For example, a segmentation component may be configured to receive, as input, image data corresponding to one or more images that include a building. For example, the segmentation component may receive image data associated with the building. In examples, the image data may correspond to a bird's eye view of the building, such as from satellite imagery. In other examples, the image data may additionally or alternatively correspond to a side view of the building, such as from a street next to the building and/or the image data may correspond to images of the interior of the building. Utilizing the bird's eye view image data, the segmentation component may utilize one or more computer vision techniques and/or models, such as image segmentation models, to determine the portions of the image that correspond to the building and portions of the image that correspond to non-building components. For example, the portions of the image corresponding to the building may be tagged as "building," and other portions of the image may be tagged as "non-building" or may be tagged as other objects such as "driveway," "sidewalk," "porch," "deck," "patio," "grass," "garden," "tree," etc. Segmentation data may be generated that utilizes the tags to separate building components from non-building components of the image. An outline of the building may be generated by utilizing the segmentation data to determine where building components and non-building components meet. For example, one or more objects may be identified and the perimeter and/or area of those objects with respect to the image may be determined. Object representations corresponding to the objects may be generated. The result of the segmentation component as described above may include the generation of the object representations and identification of the object representation that corresponds to the building depicted in the image.

The object representation may then be utilized, such as by a floor-plan generator, to generate a floor plan of the building. For example, the object representation may be utilized to generate floor-plan data indicating the exterior shape of the building and including exterior walls. Additionally, when a sidewalk is tagged in the image data, that information may be utilized to determine a location of one or more doors to the building. Representations of these doors may be included in the floor-plan data and may show an approximate location of the doors with respect to the exterior walls. Additionally, when a driveway, deck or equivalent, or grass area is tagged in the image data, that information may be utilized to determine potential flat areas associated with the building. Those flat areas may be utilized for delivery of items, such as items purchased in an online marketplace, to the building. Additionally, the image data and/or other data associated with the building, may be utilized to determine a number of levels of the building and/or outlines of the levels. For example, a side view image of the building may be utilized to determine if the building is a single-level building or multi-level building. Other information such as the square footage of the building, a description of the number of rooms and/or types of rooms of the building, and/or naming indicators associated with the devices associated with the building may be utilized to determine building levels. For example, when the square footage of the building is approximately twice the amount of the area of the generated floor plan, this information may indicate that the building has two roughly equal levels. In other examples, data indicating that the building contains many bedrooms and/or bathrooms, a basement, a loft, etc. may indicate that the building is a multi-level building. In other examples, device naming indicators such as "basement light," "main floor lights," and/or "upstairs lights" may indicate that the building includes multiple levels. Some or all of this information may be utilized by the floor-plan generator to generate the floor plans described herein.

At block 704, the process 700 may include generating one or more user interfaces including the floor plan and device representations of connected devices and/or voice-enabled devices. For example, the floor-plan data may be utilized to generate a visual representation of the floor plan for the user interface. Additionally, if images of the interior of the building have been made publicly available and the user has provided consent to the use of such images generally and/or for the purposes described in this disclosure, corresponding image data may be utilized to determine the presence and location of interior walls of the building. In these examples, representations of these interior walls may be included in the floor plan. In other examples where such image data is not available and/or consent to utilize such data is not available or has not been provided, a user interface may be generated by the user-interface generator with functionality that allows for a user to add interior walls to the floor plan. For example, the user-interface generator may generate a user interface that includes a visual representation of the floor plan. The user interface may also include a library of objects that may be added to the floor plan, such as by touch input on the user device displaying the user interface.

In these examples, the object library may include a "wall" icon that, when selected, may allow a user to provide input to the user device indicating where one or more walls are located with respect to the floor plan. The user interface may be configured to allow the user to manipulate the size and position of the walls. Additional icons such as a "door" icon and/or a "window" icon may be caused to be displayed on the user interface and may be utilized by the user to place and/or size doors and windows, respectively. The user may also utilize the user interface to correct and/or change the sizing and/or placement of the exterior walls and/or interior walls as determined by the floor-plan generator. It should be understood that while the sizing and placement of item representations is described herein with respect to example objects such as walls, doors, and windows, the object library may contain these and/or other object icons associated with any number of objects associated with a building. It should also be understood that while several of the examples herein are associated with a home, the building may include any structure that may include user devices.

At block 706, the process 700 may include determining whether input data has been received indicating that rooms of the floor plan have been labeled. For example, the user interface may allow a user to label one or more rooms of the floor plan, such as labelling the rooms as "kitchen," "family room," "office," "dining room," "hallway," etc. When room labels such as these are provided, the system may utilize the naming indicators of the devices to determine where device representations should be placed.

In examples where such input data has been received, the process 700 may include, at block 708, causing a user device displaying the user interface to display device representations based at least in part on the room labels. For example, the devices may include devices with the naming indicators of "Kitchen Light 1," "Kitchen Light 2," "Family Room Speaker 1," and "Family Room Speaker 2." In these examples where room labels have been identified, the device representations associated with such room labels may be placed in their respective rooms. For example, if a room of the floor plan is labeled "Kitchen," the device representations associated with device naming indicators that include "kitchen" or similar words may be placed on the portion of the floor plan corresponding to the kitchen.

Alternatively, when room labels have not been provided but device naming indicators are known, the device naming indicators may be utilized to generate room labels and place devices. Utilizing the example provided above, a user may provide input such as moving the device representation for "Kitchen Light 1" from the object library to a representation of a room of the floor plan. The system may receive input data corresponding to that input and may utilize the input data to generate a "Kitchen" room label for the room in question. The system may also determine which other devices have naming indicators that include "kitchen" or a similar word and may place corresponding device representations in the "Kitchen" portion of the floor plan. Additionally, in examples where the account data indicates groupings of devices, those groupings may be utilized to inform which devices are to be associated with which room labels.

In examples where the input data has not been received, and/or following the processes at block 708, at block 710 the process 700 may include determining whether device-affinity data is available for the connected devices and/or voice-enabled devices. For example, as the devices are utilized, usage data associated with the devices may be generated. That usage data may include device-affinity data indicating which connected devices communicate with which voice-enabled devices most frequently.

In examples where device-affinity data is available, then at block 712 the process 700 may include causing the user device displaying the user interface to display the device representations based at least in part on the device-affinity data. For example, the connected devices that have the most favorable device affinity for a given voice-enabled device may be placed in proximity to the voice-enabled devices.

In examples where device-affinity data is not available, or following the processes performed at block 710, at block 714 the process 700 may include determining whether signal-strength data is available for the connected devices and/or the voice-enabled devices. For example, the usage data may also include signal-strength data indicating a signal strength, such as for communication signals sent between devices utilizing one or more communication protocols. Stronger signal strength may indicate that the two devices are physically closer to each other than two devices having lower signal strength. Additionally, with respect to the voice-enabled devices, the voice-enabled devices may include multiple microphones for capturing audio. The microphones may be arranged in an array and may be configured to each receive audio from the environment and generate audio data corresponding to the audio. The audio data may be analyzed to determine the direction of the source of the audio with respect to the microphones. This information, as well as acoustic echo information for example, may be utilized by the voice-enabled devices to determine a location of the voice-enabled devices within a given room.

In examples where the signal-strength data is available, then at block 716 the process 700 may include causing the user device displaying the user interface to display device representations based at least in part on the signal-strength data. For example, a distance between devices and/or a direction of a given connected device from a given voice-enabled device may be determined and the visual representations of these devices may be placed with respect to the floor plan in a manner that indicates the distance and direction.

In examples where the signal-strength data is not available, or following the processes performed at block 716, at block 718 the process 700 may include receiving confirmation of device representation placement from the user device. For example, the user interface may be configured to receive user input including moving the device representations and/or confirming that the placement of the device representations as displayed on the user device is accurate. In examples, instead of confirming the placement of the device representations, the user input may indicate a change to the placement of the device representations. In these examples, one or more of the processes described at blocks 706-716 may be performed utilizing the new placement of the device representation.

At block 720, the process 700 may include enabling control of the connected devices and/or the voice-enabled devices utilizing the user interface. For example, a device-state component may enable functionality that allows for control of the devices utilizing a user device. For example, the user interface may be displayed on the user device and may include the floor plan and the device representations. The device representations may be selectable or the user device may otherwise be configured to receive user input to operate the connected devices. For example, the user device may include a touchscreen and the user may touch a portion of a screen of the user device that is displaying a given device representation, such as a device representation associated with a light. The user device may generate corresponding input data indicating selection of the device representation, which may cause the user device to generate a request to operate the connected device. In other examples, the input data may be sent to a voice-enabled device, the system, and/or another device or system, which may generate the request to operate the connected device.

The request may be sent to the connected device corresponding to the device representation, and the connected device may process the request and perform the indicated operation. In examples, the connected device may send a response indicating that the operation has been performed, and in these examples the user interface may cause display of an indication that the operation has been performed. By way of example, the light device representation may change color, size, emphasis, etc. to indicate that the light has been turned on. In examples, the connected device may be configured to perform multiple functions and/or may have multiple options for performing such functions, such as a dimness of light emission, a light color, etc. In these examples, the user interface may include options associated with such functionality, which may be displayed based at least in part on selection of the device representation. It should be understood that while the state of the device may be received from the connected device at issue, data indicating the state of the device may additionally, or alternatively, be received by the smart-device system and/or the speech-processing system.

FIG. 8 illustrates a flow diagram of another example process 800 for floor plan generation for device visualization and use. The order in which the operations or steps are described is not intended to be construed as a limitation, and any number of the described operations may be combined in any order and/or in parallel to implement process 800.

At block 802, the process 800 may include receiving image data corresponding to an image depicting a building and an object. For example, a segmentation component may receive image data associated with the building. In examples, the image data may correspond to a bird's eye view of the building, such as from satellite imagery. In other examples, the image data may additionally or alternatively correspond to a side view of the building, such as from a street next to the building and/or the image data may correspond to images of the interior of the building.

At block 804, the process 800 may include generating, utilizing computer vision processing, first data representing the building, the first data representing first coordinates in a coordinate system that correspond to the building. For example, the segmentation component may utilize one or more computer vision techniques and/or models, such as image segmentation models, to determine the portions of the image that correspond to the building and portions of the image that correspond to non-building components. For example, the portions of the image corresponding to the building may be tagged as "building," and other portions of the image may be tagged as "non-building" or may be tagged as other objects such as "driveway," "sidewalk," "porch," "deck," "patio," "grass," "garden," "tree," etc. Segmentation data may be generated that utilizes the tags to separate building components from non-building components of the image. An outline of the building may be generated by utilizing the segmentation data to determine where building components and non-building components meet. For example, one or more objects may be identified and the perimeter and/or area of those objects with respect to the image may be determined. Object representations corresponding to the objects may be generated. The result of the segmentation component as described above may include the generation of the object representations and identification of the object representation that corresponds to the building depicted in the image.

At block 806, the process 800 may include generating, using the first data, second data representing a floor plan corresponding to the building, the second data representing a portion of the first coordinates that correspond to exterior wall representations arranged in the shape of the building. For example, the object representation of the building may be utilized, such as by a floor-plan generator, to generate a floor plan of the building. For example, the object representation may be utilized to generate floor-plan data indicating the exterior shape of the building and including exterior walls. Additionally, when a sidewalk is tagged in the image data, that information may be utilized to determine a location of one or more doors to the building. Representations of these doors may be included in the floor-plan data and may show an approximate location of the doors with respect to the exterior walls. Additionally, when a driveway, deck or equivalent, or grass area is tagged in the image data, that information may be utilized to determine potential flat areas associated with the building. Those flat areas may be utilized for delivery of items, such as items purchased in an online marketplace, to the building. Additionally, the image data and/or other data associated with the building, may be utilized to determine a number of levels of the building and/or outlines of the levels. For example, a side view image of the building may be utilized to determine if the building is a single-level building or multi-level building. Other information such as the square footage of the building, a description of the number of rooms and/or types of rooms of the building, and/or naming indicators associated with the devices associated with the building may be utilized to determine building levels. For example, when the square footage of the building is approximately twice the amount of the area of the generated floor plan, this information may indicate that the building has two roughly equal levels. In other examples, data indicating that the building contains many bedrooms and/or bathrooms, a basement, a loft, etc. may indicate that the building is a multi-level building. In other examples, device naming indicators such as "basement light," "main floor lights," and/or "upstairs lights" may indicate that the building includes multiple levels. Some or all of this information may be utilized by the floor-plan generator to generate the floor plans described herein.

When representations of devices and/or other objects such as walls, windows, doors, etc. are described as being positioned in association with a given floor plan, such placement may be based on a spatial relationship between the devices and/or objects. For example, a grid-based coordinate system may be generated and may be utilized to assign coordinates in the coordinate system to the various representations. For example, the grid-based coordinate system may include coordinates in two or more dimensions and the coordinate system may be generated to represent a to-scale representation of the building in question and the objects and/or devices associated with that building. By way of example, when a floor plan is generated as described herein, representations of the exterior walls of the building may be assigned coordinates in the coordinate system. These coordinates may be utilized by the system to determine where the exterior walls are with respect to each other and with respect to objects associated with the building. Likewise, the device and object representations may also be assigned coordinates to indicate where in the coordinate system those representations should be located. The device-associated data described herein, such as device-affinity data, signal-strength data, selection data, and/or acoustic region data may be utilized to determine physical distances between devices and/or to determine sections of the floor plan that should include the devices. This information may be utilized to determine which coordinates of the coordinate system should be assigned to the device representations. It should be understood that while a grid-based coordinate system is utilized herein, one or more other systems to represent the spatial relationship between objects and/or devices may be utilized.

At block 808, the process 800 may include determining third data indicating second coordinates that correspond to a location of a device associated with the building. For example, the system may query a user registry to determine which electronic devices are associated with the building. By way of example, a voice-enabled device may be disposed within the building and that voice-enabled device may be associated with account data indicating the address of the building, user identifier data, one or more other voice-enabled devices associated with the building, and/or one or more connected devices associated with the voice-enabled device(s).

At block 810, the process 800 may include generating, utilizing the at least the portion of the first coordinates and the second coordinates, a user interface including: a first visual representation of the floor plan; and a second visual representation of the device, the second visual representation positioned on the first visual representation to indicate placement of the device in the building, the second visual representation selectable to cause operation of the device. Visual representations of these electronic devices may be generated and may be included in the object library. The visual representations may include icons of the devices, which may be generic device icons and/or may be based at least in part on the device type of a given device, and/or text showing a naming indicator for the device. The naming indicator may correspond to a device name provided by a user and/or a device name provided by a smart-device system associated with the device and/or a device name determined by the speech-processing system.

Additionally, or alternatively, the process 800 may include generating fourth data indicating that the first device is utilized to control a second device more often than a third device is utilized to control the second device. The process 800 may also include causing, from the fourth data, a user device displaying the user interface to display a third visual representation of a second device at third coordinates that are closer to the second coordinates than to fourth coordinates corresponding to a location of the third device.

Additionally, or alternatively, the process 800 may include storing fourth data indicating a first naming indicator of the device. The process 800 may also include determining that the naming indicator includes a room name and determining a portion of the first coordinates associated with the room name. In these examples, determining the third data indicating the second coordinates includes determining the portion of the first coordinates associated with the room name.

Additionally, or alternatively, the process 800 may include storing: fourth data indicating a first wireless signal strength from signals sent between the first device and a second device; and fifth data indicating a second wireless signal strength from signals sent between the first device and a third device. The process 800 may also include determining, utilizing the fourth data and the fifth data, that the first wireless signal strength is stronger than the second wireless signal strength. In these examples, generating the user interface includes causing, in response to the first wireless signal strength being stronger than the second wireless signal strength, a third visual representation of the second device to be positioned closer to second coordinates than to third coordinates corresponding to a location of the third device.

FIG. 9 illustrates a flow diagram of another example process 900 for floor plan generation for device visualization and use. The order in which the operations or steps are described is not intended to be construed as a limitation, and any number of the described operations may be combined in any order and/or in parallel to implement process 900.

At block 902, the process 900 may include generating, based at least in part on first data including an image of a building, second data representing a floor plan of the building, the floor plan representing first coordinates of a coordinate system that correspond to exterior wall representations arranged in the shape of the building. For example, a segmentation component may receive image data associated with the building. In examples, the image data may correspond to a bird's eye view of the building, such as from satellite imagery. In other examples, the image data may additionally or alternatively correspond to a side view of the building, such as from a street next to the building and/or the image data may correspond to images of the interior of the building.

The segmentation component may utilize one or more computer vision techniques and/or models, such as image segmentation models, to determine the portions of the image that correspond to the building and portions of the image that correspond to non-building components. For example, the portions of the image corresponding to the building may be tagged as "building," and other portions of the image may be tagged as "non-building" or may be tagged as other objects such as "driveway," "sidewalk," "porch," "deck," "patio," "grass," "garden," "tree," etc. Segmentation data may be generated that utilizes the tags to separate building components from non-building components of the image. An outline of the building may be generated by utilizing the segmentation data to determine where building components and non-building components meet. For example, one or more objects may be identified and the perimeter and/or area of those objects with respect to the image may be determined. Object representations corresponding to the objects may be generated. The result of the segmentation component as described above may include the generation of the object representations and identification of the object representation that corresponds to the building depicted in the image.

The object representation of the building may be utilized, such as by a floor-plan generator, to generate a floor plan of the building. For example, the object representation may be utilized to generate floor-plan data indicating the exterior shape of the building and including exterior walls. Additionally, when a sidewalk is tagged in the image data, that information may be utilized to determine a location of one or more doors to the building. Representations of these doors may be included in the floor-plan data and may show an approximate location of the doors with respect to the exterior walls. Additionally, when a driveway, deck or equivalent, or grass area is tagged in the image data, that information may be utilized to determine potential flat areas associated with the building. Those flat areas may be utilized for delivery of items, such as items purchased in an online marketplace, to the building. Additionally, the image data and/or other data associated with the building, may be utilized to determine a number of levels of the building and/or outlines of the levels. For example, a side view image of the building may be utilized to determine if the building is a single-level building or multi-level building. Other information such as the square footage of the building, a description of the number of rooms and/or types of rooms of the building, and/or naming indicators associated with the devices associated with the building may be utilized to determine building levels. For example, when the square footage of the building is approximately twice the amount of the area of the generated floor plan, this information may indicate that the building has two roughly equal levels. In other examples, data indicating that the building contains many bedrooms and/or bathrooms, a basement, a loft, etc. may indicate that the building is a multi-level building. In other examples, device naming indicators such as "basement light," "main floor lights," and/or "upstairs lights" may indicate that the building includes multiple levels. Some or all of this information may be utilized by the floor-plan generator to generate the floor plans described herein.

At block 904, the process 900 may include determining third data indicating second coordinates that correspond to a location of a device associated with the building. For example, the system may query a user registry to determine which electronic devices are associated with the building. By way of example, a voice-enabled device may be disposed within the building and that voice-enabled device may be associated with account data indicating the address of the building, user identifier data, one or more other voice-enabled devices associated with the building, and/or one or more connected devices associated with the voice-enabled device(s).

At block 906, the process 900 may include generating, based at least in part on the first coordinates and the second coordinates, a user interface including: a first visual representation of the floor plan; and a second visual representation of the device positioned on the first visual representation, the second visual representation selectable to cause operation of the device. Visual representations of these electronic devices may be generated and may be included in the object library. The visual representations may include icons of the devices, which may be generic device icons and/or may be based at least in part on the device type of a given device, and/or text showing a naming indicator for the device. The naming indicator may correspond to a device name provided by a user and/or a device name provided by a smart-device system associated with the device and/or a device name determined by the speech-processing system.

When representations of devices and/or other objects such as walls, windows, doors, etc. are described as being positioned in association with a given floor plan, such placement may be based on a spatial relationship between the devices and/or objects. For example, a grid-based coordinate system may be generated and may be utilized to assign coordinates in the coordinate system to the various representations. For example, the grid-based coordinate system may include coordinates in two or more dimensions and the coordinate system may be generated to represent a to-scale representation of the building in question and the objects and/or devices associated with that building. By way of example, when a floor plan is generated as described herein, representations of the exterior walls of the building may be assigned coordinates in the coordinate system. These coordinates may be utilized by the system to determine where the exterior walls are with respect to each other and with respect to objects associated with the building. Likewise, the device and object representations may also be assigned coordinates to indicate where in the coordinate system those representations should be located. The device-associated data described herein, such as device-affinity data, signal-strength data, selection data, and/or acoustic region data may be utilized to determine physical distances between devices and/or to determine sections of the floor plan that should include the devices. This information may be utilized to determine which coordinates of the coordinate system should be assigned to the device representations. It should be understood that while a grid-based coordinate system is utilized herein, one or more other systems to represent the spatial relationship between objects and/or devices may be utilized.

Additionally, or alternatively, the process 900 may include generating fourth data indicating that the first device is utilized to control a second device more often than a third device is utilized to control the second device. The process 900 may also include causing, from the fourth data, a user device displaying the user interface to display a third visual representation of a second device at third coordinates that are closer to the second coordinates than to fourth coordinates corresponding to a location of the third device.

Additionally, or alternatively, the process 900 may include storing fourth data indicating a first naming indicator of the device. The process 900 may also include determining that the naming indicator includes a room name and determining a portion of the first coordinates associated with the room name. In these examples, determining the third data indicating the second coordinates may include determining the portion of the first coordinates associated with the room name.

Additionally, or alternatively, the process 900 may include storing: fourth data indicating a first wireless signal strength from signals sent between the first device and a second device; and fifth data indicating a second wireless signal strength from signals sent between the first device and a third device. The process 900 may also include determining, utilizing the fourth data and the fifth data, that the first wireless signal strength is stronger than the second wireless signal strength. In these examples, generating the user interface may include causing, in response to the first wireless signal strength being stronger than the second wireless signal strength, a third visual representation of the second device to be positioned closer to second coordinates than to third coordinates corresponding to a location of the third device.

Additionally, or alternatively, the process 900 may include receiving input data indicating that the icon has been placed in proximity to the second coordinates associated with the device. The process 900 may also include generating, based at least in part on receiving the input data, fourth data indicating that the device is scheduled to perform an action upon occurrence of the event. The process 900 may also include causing the user interface to include an indication that the device is scheduled to perform the action upon occurrence of the event.

Additionally, or alternatively, the process 900 may include receiving, from at least one of the device or a remote system associated with the device, fourth data indicating an operational state of the device. The process 900 may also include causing the user interface to include a first indication of the operational state of the device. The process 900 may also include determining that the operational state differs from a historical operational state of the device. The process 900 may also include causing the user interface to include a second indication that the operational state differs from the historical operational state.

Additionally, or alternatively, the process 900 may include receiving first input data indicating that the second visual representation and a third visual representation associated with a second device have been placed in a location corresponding to a portion of the first coordinates representing a room of the floor plan. The process 900 may also include associating the first device and the second device as a device group based at least in part on the first input data. The process 900 may also include receiving second input data indicating a naming indicator for the room. The process 900 may also include associating the device group with the naming indicator based at least in part on the second input data.

Additionally, or alternatively, the process 900 may include receiving first input data indicating that the second visual representation has been placed in a location corresponding to a portion of the first coordinates representing a room of the floor plan. The process 900 may also include receiving second input data indicating selection, on a user device displaying the user interface, of a naming indicator of the room. The process 900 may also include causing, based at least in part on the first input data and receiving the second input data, the device to perform an operation.

Figure 10:
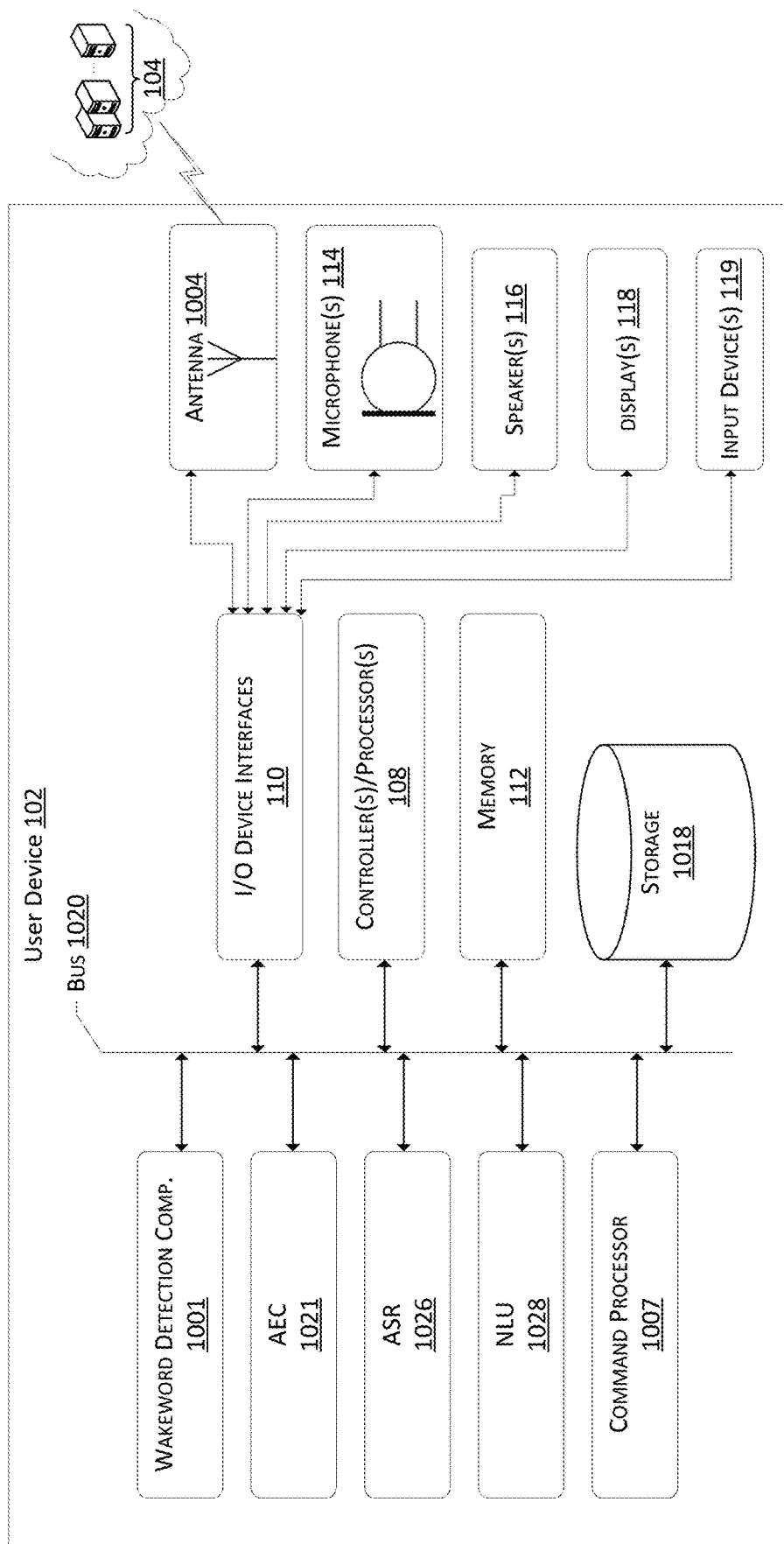
FIG. 10 illustrates a conceptual diagram of example components of a computing device configured to display user interfaces of generated floor plans for device visualization and use.

FIG. 10 illustrates a conceptual diagram of example components of a user device configured to display user interfaces of generated floor plans for device visualization and use. The user device 102 may be implemented as a standalone device that is relatively simple in terms of functional capabilities with limited input/output components, memory, and processing capabilities. For instance, the user device 102 may not have a keyboard, keypad, touchscreen, or other form of mechanical input. In some instances, the device 102 may include a microphone 114, a power source, and functionality for sending generated audio data via one or more antennas 1004 to another device and/or system.

The device 102 may also be implemented as a more sophisticated computing device, such as a computing device similar to, or the same as, a smart phone or personal digital assistant. The device 102 may include a display 118 with a touch interface and various buttons for providing input as well as additional functionality such as the ability to send and receive communications. Alternative implementations of the device 102 may also include configurations as a personal computer. The personal computer may include input devices 119 such as a keyboard, a mouse, a touchscreen, and other hardware or functionality that is found on a desktop, notebook, netbook, or other personal computing devices. In examples, the device 102 may include an automobile, such as a car. In other examples, the device 102 may include a pin on a user's clothes or a phone on a user's person. In examples, the device 102 may or may not include speaker(s) and may utilize speaker(s) of an external or peripheral device to output audio via the speaker(s) of the external/peripheral device. In this example, the device 102 might represent a set-top box (STB), and the device 102 may utilize speaker(s) of another device such as a television that is connected to the STB for output of audio via the external speakers. In other examples, the device 102 may not include the microphone(s) 114, and instead, the device 102 can utilize microphone(s) of an external or peripheral device to capture audio and/or generate audio data. In this example, the device 102 may utilize microphone(s) of a headset that is coupled (wired or wirelessly) to the device 102. These types of devices are provided by way of example and are not intended to be limiting, as the techniques described in this disclosure may be used in essentially any device that has an ability to recognize speech input or other types of natural language input.

The device 102 of FIG. 10 may include one or more controllers/processors 108, that may include a central processing unit (CPU) for processing data and computer-readable instructions, and memory 112 for storing data and instructions of the device 102. In examples, the skills and/or applications described herein may be stored in association with the memory 112, which may be queried for content and/or responses as described herein. The device 102 may also be connected to removable or external non-volatile memory and/or storage, such as a removable memory card, memory key drive, networked storage, etc., through input/output device interfaces 110.

Computer instructions for operating the device 102 and its various components may be executed by the device's controller(s)/processor(s) 108, using the memory 112 as temporary "working" storage at runtime. A device's computer instructions may be stored in a non-transitory manner in non-volatile memory 112, storage 1018, or an external device(s). Alternatively, some or all of the executable instructions may be embedded in hardware or firmware on the device 102 in addition to or instead of software.

The device 102 may include input/output device interfaces 110. A variety of components may be connected through the input/output device interfaces 110. Additionally, the device 102 may include an address/data bus 1020 for conveying data among components of the respective device. Each component within a device 102 may also be directly connected to other components in addition to, or instead of, being connected to other components across the bus 1020.

The device 102 may include a display 118, which may comprise a touch interface. Any suitable display technology, such as liquid crystal display (LCD), organic light emitting diode (OLED), electrophoretic, and so on, may be utilized for the displays. Furthermore, the processor(s) 108 may comprise graphics processors for driving animation and video output on the associated display 118. As a way of indicating to a user that a connection between another device has been opened, the device 102 may be configured with one or more visual indicators, such as the light element(s), which may be in the form of LED(s) or similar components (not illustrated), that may change color, flash, or otherwise provide visible light output, such as for a notification indicator on the device 102. The input/output device interfaces 110 that connect to a variety of components. This wired or a wireless audio and/or video port may allow for input/output of audio/video to/from the device 102. The device 102 may also include an audio capture component. The audio capture component may be, for example, a microphone 114 or array of microphones, a wired headset or a wireless headset, etc. The microphone 114 may be configured to capture audio. If an array of microphones is included, approximate distance to a sound's point of origin may be determined using acoustic localization based on time and amplitude differences between sounds captured by different microphones of the array. The device 102 (using microphone 112, wakeword detection component 1001, ASR component 1026, etc.) may be configured to generate audio data corresponding to captured audio. The device 102 (using input/output device interfaces 110, antenna 1004, etc.) may also be configured to transmit the audio data to the remote system 104 for further processing or to process the data using internal components such as a wakeword detection component 1001.

Via the antenna(s) 1004, the input/output device interface 110 may connect to one or more networks via a wireless local area network (WLAN) (such as WiFi™) radio, Bluetooth, and/or wireless network radio, such as a radio capable of communication with a wireless communication network such as a Long Term Evolution (LTE™) network, WiMAX® network, 3G network, 4G network, 5G network, etc. A wired connection such as Ethernet may also be supported. Universal Serial Bus (USB) connections may also be supported. Power may be provided to the device 102 via wired connection to an external alternating current (AC) outlet, and/or via onboard power sources, such as batteries, solar panels, etc.

Through the network(s), the system may be distributed across a networked environment. Accordingly, the device 102 and/or the remote system 104 may include an ASR component 1026. The ASR component 1026 of device 102 may be of limited or extended capabilities. The ASR component 1026 may include language models stored in ASR model storage component, and an ASR component 1026 that performs automatic speech recognition. If limited speech recognition is included, the ASR component 1026 may be configured to identify a limited number of words, such as keywords detected by the device, whereas extended speech recognition may be configured to recognize a much larger range of words.

The device 102 and/or the remote system 104 may include a limited or extended NLU component 1028. The NLU component 1028 of device 102 may be of limited or extended capabilities. The NLU component 1028 may comprise a name entity recognition module, an intent classification module and/or other components. The NLU component 1028 may also include a stored knowledge base and/or entity library, or those storages may be separately located.

In examples, acoustic echo cancellation (AEC) may also be performed by the device 102. In these examples, the operations may include causing the AEC component 1021 to be enabled or otherwise turned on, or the operations may include causing the AEC component 1021 to transition from a first mode to a second mode representing a higher sensitivity to audio data generated by the microphone 114. The AEC component 1021 may utilize the audio data generated by the microphone 114 to determine if an audio fingerprint of the audio data, or portion thereof, corresponds to a reference audio fingerprint associated with the predefined event.

The device 102 and/or the remote system 104 may also include a command processor 1007 that is configured to execute commands/functions associated with a spoken command as described herein. The device 102 may include a wakeword detection component 1001, which may be a separate component or may be included in an ASR component 1026. The wakeword detection component 1001 receives audio signals and detects occurrences of a particular expression (such as a configured keyword) in the audio. This may include detecting a change in frequencies over a specific period of time where the change in frequencies results in a specific audio fingerprint that the system recognizes as corresponding to the keyword. Keyword detection may include analyzing individual directional audio signals, such as those processed post-beamforming if applicable. Other techniques known in the art of keyword detection (also known as keyword spotting) may also be used. In some embodiments, the device 102 may be configured collectively to identify a set of the directional audio signals in which the wake expression is detected or in which the wake expression is likely to have occurred.

Figure 11:
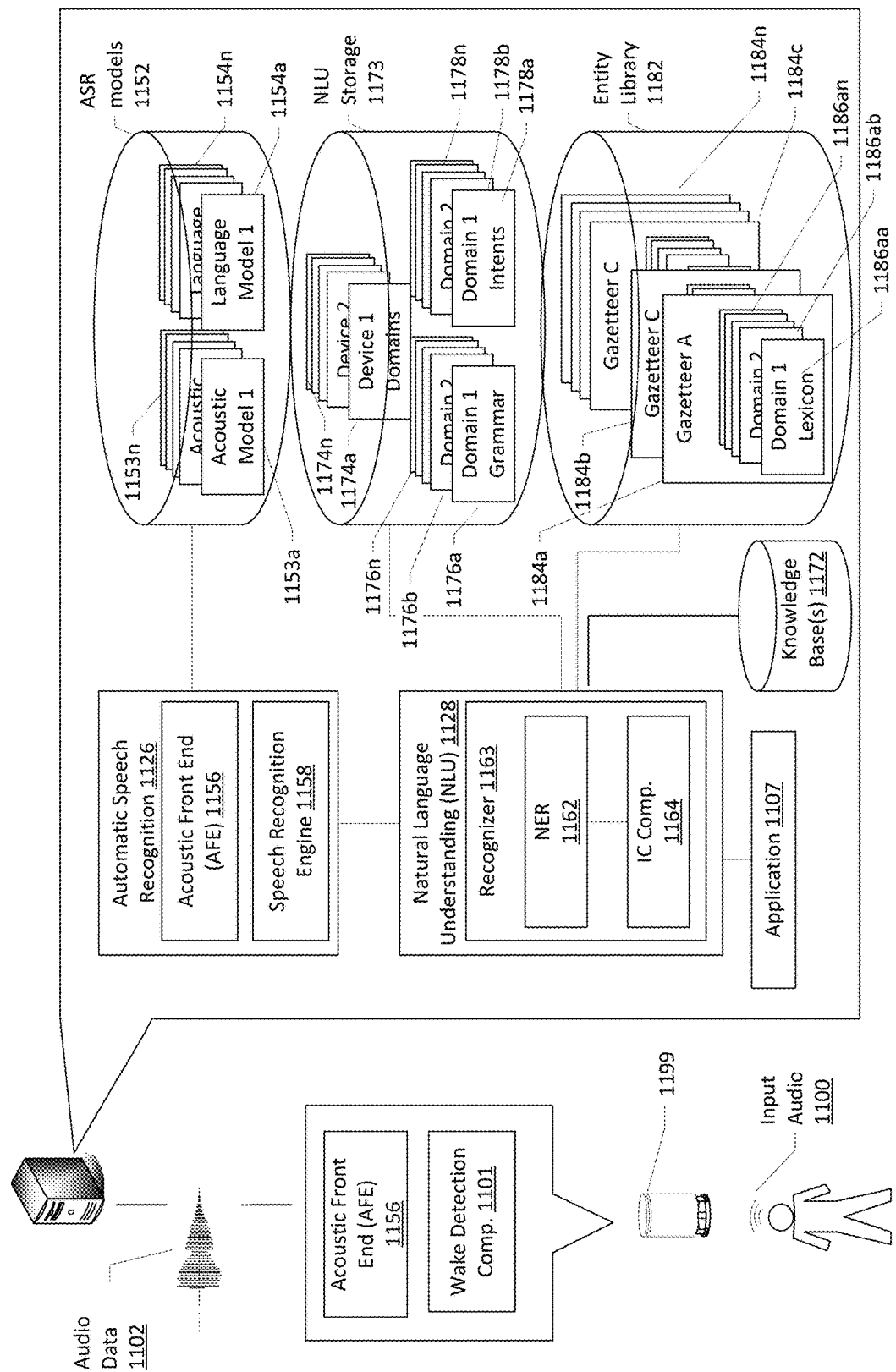
FIG. 11 illustrates a conceptual diagram of components of a speech-processing system for processing audio data provided by one or more devices.

FIG. 11 illustrates a conceptual diagram of how a spoken utterance can be processed, allowing a system to capture and execute commands spoken by a user, such as spoken commands that may follow a wakeword, or trigger expression, (i.e., a predefined word or phrase for "waking" a device, causing the device to begin sending audio data to a remote system, such as system 104). The various components illustrated may be located on a same device or different physical devices. Message between various components illustrated in FIG. 11 may occur directly or across a network 106. An audio capture component, such as a microphone of the device 1199, or another device, captures audio 1100 corresponding to a spoken utterance. The device 1199, using a wake-word component 1101, then processes audio data corresponding to the audio 1100 to determine if a keyword (such as a wakeword) is detected in the audio data. Following detection of a wakeword, the device 1199 sends audio data 1102 corresponding to the utterance to the remote system 104 that includes an ASR component 1126. The audio data 1102 may be output from an optional acoustic front end (AFE) 1156 located on the device prior to transmission. In other instances, the audio data 1102 may be in a different form for processing by a remote AFE 1156, such as the AFE 1156 located with the ASR component 1126 of the remote system 104.

The wake-word component 1101 works in conjunction with other components of the user device, for example a microphone to detect keywords in audio 1100. For example, the device may convert audio 1100 into audio data, and process the audio data with the wake-word component 1101 to determine whether human sound is detected, and if so, if the audio data comprising human sound matches an audio signature and/or model corresponding to a particular keyword.

The user device may use various techniques to determine whether audio data includes human sound. Some embodiments may apply voice activity detection (VAD) techniques. Such techniques may determine whether human sound is present in an audio input based on various quantitative aspects of the audio input, such as the spectral slope between one or more frames of the audio input; the energy levels of the audio input in one or more spectral bands; the signal-to-noise ratios of the audio input in one or more spectral bands; or other quantitative aspects. In other embodiments, the user device may implement a limited classifier configured to distinguish human sound from background noise. The classifier may be implemented by techniques such as linear classifiers, support vector machines, and decision trees. In still other embodiments, Hidden Markov Model (HMM) or Gaussian Mixture Model (GMM) techniques may be applied to compare the audio input to one or more acoustic models in human sound storage, which acoustic models may include models corresponding to human sound, noise (such as environmental noise or background noise), or silence. Still other techniques may be used to determine whether human sound is present in the audio input.

Once human sound is detected in the audio received by user device (or separately from human sound detection), the user device may use the wake-word component 1101 to perform wakeword detection to determine when a user intends to speak a command to the user device. This process may also be referred to as keyword detection, with the wakeword being a specific example of a keyword. Specifically, keyword detection may be performed without performing linguistic analysis, textual analysis or semantic analysis. Instead, incoming audio (or audio data) is analyzed to determine if specific characteristics of the audio match preconfigured acoustic waveforms, audio signatures, or other data to determine if the incoming audio "matches" stored audio data corresponding to a keyword.

Thus, the wake-word component 1101 may compare audio data to stored models or data to detect a wakeword. One approach for wakeword detection applies general large vocabulary continuous speech recognition (LVCSR) systems to decode the audio signals, with wakeword searching conducted in the resulting lattices or confusion networks. LVCSR decoding may require relatively high computational resources. Another approach for wakeword spotting builds hidden Markov models (HMM) for each key wakeword word and non-wakeword speech signals respectively. The non-wakeword speech includes other spoken words, background noise, etc. There can be one or more HMMs built to model the non-wakeword speech characteristics, which are named filler models. Viterbi decoding is used to search the best path in the decoding graph, and the decoding output is further processed to make the decision on keyword presence. This approach can be extended to include discriminative information by incorporating hybrid DNN-HMM decoding framework. In another embodiment, the wakeword spotting system may be built on deep neural network (DNN)/recursive neural network (RNN) structures directly, without HMM involved. Such a system may estimate the posteriors of wakewords with context information, either by stacking frames within a context window for DNN, or using RNN. Following-on posterior threshold tuning or smoothing is applied for decision making. Other techniques for wakeword detection, such as those known in the art, may also be used.

Once the wakeword is detected, the local device 1199 may "wake" and begin transmitting audio data 1102 corresponding to input audio 1100 to the remote system 104 for speech processing. Audio data corresponding to that audio may be sent to remote system 104 for routing to a recipient device or may be sent to the remote system 106 for speech processing for interpretation of the included speech (either for purposes of enabling voice-messages and/or for purposes of executing a command in the speech). The audio data 1102 may include data corresponding to the wakeword, or the portion of the audio data corresponding to the wakeword may be removed by the local device 1199 prior to sending. Further, a local device may "wake" upon detection of speech/spoken audio above a threshold, as described herein. Upon receipt by the remote system 106, an ASR component 1126 may convert the audio data 1102 into text. The ASR transcribes audio data into text data representing the words of the speech contained in the audio data 1102. The text data may then be used by other components for various purposes, such as executing system commands, inputting data, etc. A spoken utterance in the audio data is input to a processor configured to perform ASR which then interprets the utterance based on the similarity between the utterance and pre-established language models 1154 stored in an ASR model knowledge base (ASR Models Storage 1152). For example, the ASR process may compare the input audio data with models for sounds (e.g., subword units or phonemes) and sequences of sounds to identify words that match the sequence of sounds spoken in the utterance of the audio data.

The different ways a spoken utterance may be interpreted (i.e., the different hypotheses) may each be assigned a probability or a confidence score representing the likelihood that a particular set of words matches those spoken in the utterance. The confidence score may be based on a number of factors including, for example, the similarity of the sound in the utterance to models for language sounds (e.g., an acoustic model 1153 stored in an ASR Models Storage 1152), and the likelihood that a particular word that matches the sounds would be included in the sentence at the specific location (e.g., using a language or grammar model). Thus, each potential textual interpretation of the spoken utterance (hypothesis) is associated with a confidence score. Based on the considered factors and the assigned confidence score, the ASR process 1126 outputs the most likely text recognized in the audio data. The ASR process may also output multiple hypotheses in the form of a lattice or an N-best list with each hypothesis corresponding to a confidence score or other score (such as probability scores, etc.).

The device or devices performing the ASR processing may include an acoustic front end (AFE) 1156 and a speech recognition engine 1158. The acoustic front end (AFE) 1156 transforms the audio data from the microphone into data for processing by the speech recognition engine 1158. The speech recognition engine 1158 compares the speech recognition data with acoustic models 1153, language models 1154, and other data models and information for recognizing the speech conveyed in the audio data. The AFE 1156 may reduce noise in the audio data and divide the digitized audio data into frames representing time intervals for which the AFE 1156 determines a number of values, called features, representing the qualities of the audio data, along with a set of those values, called a feature vector, representing the features/qualities of the audio data within the frame. Many different features may be determined, as known in the art, and each feature represents some quality of the audio that may be useful for ASR processing. A number of approaches may be used by the AFE to process the audio data, such as mel-frequency cepstral coefficients (MFCCs), perceptual linear predictive (PLP) techniques, neural network feature vector techniques, linear discriminant analysis, semi-tied covariance matrices, or other approaches known to those of skill in the art.

The speech recognition engine 1158 may process the output from the AFE 1156 with reference to information stored in speech/model storage (1152). Alternatively, post front-end processed data (such as feature vectors) may be received by the device executing ASR processing from another source besides the internal AFE. For example, the user device may process audio data into feature vectors (for example using an on-device AFE 1156) and transmit that information to a server across a network for ASR processing. Feature vectors may arrive at the remote system 104 encoded, in which case they may be decoded prior to processing by the processor executing the speech recognition engine 1158.

The speech recognition engine 1158 attempts to match received feature vectors to language phonemes and words as known in the stored acoustic models 1153 and language models 1154. The speech recognition engine 1158 computes recognition scores for the feature vectors based on acoustic information and language information. The acoustic information is used to calculate an acoustic score representing a likelihood that the intended sound represented by a group of feature vectors matches a language phoneme. The language information is used to adjust the acoustic score by considering what sounds and/or words are used in context with each other, thereby improving the likelihood that the ASR process will output speech results that make sense grammatically. The specific models used may be general models or may be models corresponding to a particular domain, such as music, banking, etc. By way of example, a user utterance may be "Alexa, what is the title of this song?" The wake detection component may identify the wake word, otherwise described as a trigger expression, "Alexa," in the user utterance and may "wake" based on identifying the wake word. Audio data corresponding to the user utterance may be sent to the remote system 104, where the speech recognition engine 1158 may identify, determine, and/or generate text data corresponding to the user utterance, here "what is the title of this song."

The speech recognition engine 1158 may use a number of techniques to match feature vectors to phonemes, for example using Hidden Markov Models (HMMs) to determine probabilities that feature vectors may match phonemes. Sounds received may be represented as paths between states of the HMM and multiple paths may represent multiple possible text matches for the same sound.

Following ASR processing, the ASR results may be sent by the speech recognition engine 1158 to other processing components, which may be local to the device performing ASR and/or distributed across the network(s). For example, ASR results in the form of a single textual representation of the speech, an N-best list including multiple hypotheses and respective scores, lattice, etc. may be sent to the remote system 106, for natural language understanding (NLU) processing, such as conversion of the text into commands for execution, either by the user device, by the remote system 104, or by another device (such as a server running a specific application like a search engine, etc.).

The device performing NLU processing 1128 (e.g., server 104) may include various components, including potentially dedicated processor(s), memory, storage, etc. As shown in FIG. 11, an NLU component 1128 may include a recognizer 1163 that includes a named entity recognition (NER) component 1162 which is used to identify portions of query text that correspond to a named entity that may be recognizable by the system. A downstream process called named entity resolution links a text portion to a specific entity known to the system. To perform named entity resolution, the system may utilize gazetteer information (1184a-1184n) stored in entity library storage 1182. The gazetteer information may be used for entity resolution, for example matching ASR results with different entities (such as electronic devices, accessory devices, etc.) Gazetteers may be linked to users (for example a particular gazetteer may be associated with a specific user's device associations), may be linked to certain domains (such as music, shopping, etc.), or may be organized in a variety of other ways.

Generally, the NLU process takes textual input (such as processed from ASR 1126 based on the utterance input audio 1100) and attempts to make a semantic interpretation of the text. That is, the NLU process determines the meaning behind the text based on the individual words and then implements that meaning. NLU processing 1128 interprets a text string to derive an intent or a desired action from the user as well as the pertinent pieces of information in the text that allow a device (e.g., device 1199) to complete that action. For example, if a spoken utterance is processed using ASR 1126 and outputs the text "what is the title of this song" the NLU process may determine that the user intended to receive information indicating the title of a song being output by a device 1199.

The NLU may process several textual inputs related to the same utterance. For example, if the ASR 1126 outputs N text segments (as part of an N-best list), the NLU may process all N outputs to obtain NLU results.

As will be discussed further below, the NLU process may be configured to parse and tag to annotate text as part of NLU processing. For example, for the text "what is the title of this song," "identify title" may be tagged as a command (to identify the title of a song) and "this song" may be tagged as the naming identifier of the song.

To correctly perform NLU processing of speech input, an NLU process 1128 may be configured to determine a "domain" of the utterance so as to determine and narrow down which services offered by the endpoint device (e.g., remote system 104 or the user device) may be relevant. For example, an endpoint device may offer services relating to interactions with a telephone service, a contact list service, a calendar/scheduling service, a music player service, etc. Words in a single text query may implicate more than one service, and some services may be functionally linked (e.g., both a telephone service and a calendar service may utilize data from the contact list).

The named entity recognition (NER) component 1162 receives a query in the form of ASR results and attempts to identify relevant grammars and lexical information that may be used to construe meaning. To do so, the NLU component 1128 may begin by identifying potential domains that may relate to the received query. The NLU storage 1173 includes a database of devices (1174a-1174n) identifying domains associated with specific devices. For example, the user device may be associated with domains for music, telephony, calendaring, contact lists, and device-specific messages, but not video. In addition, the entity library may include database entries about specific services on a specific device, either indexed by Device ID, User ID, or Household ID, or some other indicator.

In NLU processing, a domain may represent a discrete set of activities having a common theme, such as "banking," "health care," "smart home," "communications," "shopping," "music," "calendaring," etc. As such, each domain may be associated with a particular recognizer 1163, language model and/or grammar database (1176a-1176n), a particular set of intents/actions (1178a-1178n), and a particular personalized lexicon (1186). Each gazetteer (1184a-1184n) may include domain-indexed lexical information associated with a particular user and/or device. For example, the Gazetteer A (1184a) includes domain-index lexical information 1186aa to 1186an. A user's contact-list lexical information might include the names of contacts. Since every user's contact list is presumably different, this personalized information improves entity resolution.

As noted above, in traditional NLU processing, a query may be processed applying the rules, models, and information applicable to each identified domain. For example, if a query potentially implicates both messages and, for example, music, the query may, substantially in parallel, be NLU processed using the grammar models and lexical information for messages, and will be processed using the grammar models and lexical information for music. The responses based on the query produced by each set of models is scored, with the overall highest ranked result from all applied domains ordinarily selected to be the correct result.

An intent classification (IC) component 1164 parses the query to determine an intent or intents for each identified domain, where the intent corresponds to the action to be performed that is responsive to the query. Each domain is associated with a database (1178a-1178n) of words linked to intents. For example, a communications intent database may link words and phrases such as "identify song," "song title," "determine song," to a "song title" intent. By way of further example, a timer intent database may link words and phrases such as "set," "start," "initiate," and "enable" to a "set timer" intent. A voice-message intent database, meanwhile, may link words and phrases such as "send a message," "send a voice message," "send the following," or the like. The IC component 1164 identifies potential intents for each identified domain by comparing words in the query to the words and phrases in the intents database 1178. In some instances, the determination of an intent by the IC component 1164 is performed using a set of rules or templates that are processed against the incoming text to identify a matching intent.

In order to generate a particular interpreted response, the NER 1162 applies the grammar models and lexical information associated with the respective domain to actually recognize a mention of one or more entities in the text of the query. In this manner, the NER 1162 identifies "slots" or values (i.e., particular words in query text) that may be needed for later command processing. Depending on the complexity of the NER 1162, it may also label each slot with a type of varying levels of specificity (such as noun, place, device name, device location, city, artist name, song name, amount of time, timer number, or the like). Each grammar model 1176 includes the names of entities (i.e., nouns) commonly found in speech about the particular domain (i.e., generic terms), whereas the lexical information 1186 from the gazetteer 1184 is personalized to the user(s) and/or the device. For instance, a grammar model associated with the shopping domain may include a database of words commonly used when people discuss shopping.

The intents identified by the IC component 1164 are linked to domain-specific grammar frameworks (included in 1176) with "slots" or "fields" to be filled with values. Each slot/field corresponds to a portion of the query text that the system believes corresponds to an entity. To make resolution more flexible, these frameworks would ordinarily not be structured as sentences, but rather based on associating slots with grammatical tags. For example, if "song title" is an identified intent, a grammar (1176) framework or frameworks may correspond to sentence structures such as "identify {this song} song title."

For example, the NER component 1162 may parse the query to identify words as subject, object, verb, preposition, etc., based on grammar rules and/or models, prior to recognizing named entities. The identified verb may be used by the IC component 1164 to identify intent, which is then used by the NER component 1162 to identify frameworks. A framework for the intent of "play a song," meanwhile, may specify a list of slots/fields applicable to play the identified "song" and any object modifier (e.g., specifying a music collection from which the song should be accessed) or the like. The NER component 1162 then searches the corresponding fields in the domain-specific and personalized lexicon(s), attempting to match words and phrases in the query tagged as a grammatical object or object modifier with those identified in the database(s).

This process includes semantic tagging, which is the labeling of a word or combination of words according to their type/semantic meaning. Parsing may be performed using heuristic grammar rules, or an NER model may be constructed using techniques such as hidden Markov models, maximum entropy models, log linear models, conditional random fields (CRF), and the like.

The frameworks linked to the intent are then used to determine what database fields should be searched to determine the meaning of these phrases, such as searching a user's gazette for similarity with the framework slots. If the search of the gazetteer does not resolve the slot/field using gazetteer information, the NER component 1162 may search the database of generic words associated with the domain (in the knowledge base 1172). So, for instance, if the query was "identify this song," after failing to determine which song is currently being output, the NER component 1162 may search the domain vocabulary for songs that have been requested lately. In the alternative, generic words may be checked before the gazetteer information, or both may be tried, potentially producing two different results.

The output data from the NLU processing (which may include tagged text, commands, etc.) may then be sent to an application 1107. The destination application 1107 may be determined based on the NLU output. For example, if the NLU output includes a command to send a message, the destination application 1107 may be a message sending application, such as one located on the user device or in a message sending appliance, configured to execute a message sending command. If the NLU output includes a search request, the destination application 1107 may include a search engine processor, such as one located on a search server, configured to execute a search command. After the appropriate command is generated based on the intent of the user, the application 1107 may provide some or all of this information to a text-to-speech (TTS) engine. The TTS engine may then generate an actual audio file for outputting the audio data determined by the application 1107 (e.g., "okay," or "this song title is Song A"). After generating the file (or "audio data"), the TTS engine may provide this data back to the remote system 106.

The NLU operations of existing systems may take the form of a multi-domain architecture. Each domain (which may include a set of intents and entity slots that define a larger concept such as music, books etc. as well as components such as trained models, etc. used to perform various NLU operations such as NER, IC, or the like) may be constructed separately and made available to an NLU component 1128 during runtime operations where NLU operations are performed on text (such as text output from an ASR component 1126). Each domain may have specially configured components to perform various steps of the NLU operations.

For example, in a NLU system, the system may include a multi-domain architecture consisting of multiple domains for intents/commands executable by the system (or by other devices connected to the system), such as music, video, books, and information. The system may include a plurality of domain recognizers, where each domain may include its own recognizer 1163. Each recognizer may include various NLU components such as an NER component 1162, IC component 1164 and other components such as an entity resolver, or other components.

For example, a messaging domain recognizer 1163-A (Domain A) may have an NER component 1162-A that identifies what slots (i.e., portions of input text) may correspond to particular words relevant to that domain. The words may correspond to entities such as (for the messaging domain) a recipient. An NER component 1162 may use a machine learning model, such as a domain specific conditional random field (CRF) to both identify the portions corresponding to an entity as well as identify what type of entity corresponds to the text portion. The messaging domain recognizer 1163-A may also have its own intent classification (IC) component 1164-A that determines the intent of the text assuming that the text is within the proscribed domain. An IC component may use a model, such as a domain specific maximum entropy classifier to identify the intent of the text, where the intent is the action the user desires the system to perform. For this purpose, the remote system computing device 104 may include a model training component. The model training component may be used to train the classifier(s)/machine learning models discussed above.

As noted above, multiple devices may be employed in a single speech-processing system. In such a multi-device system, each of the devices may include different components for performing different aspects of the speech processing. The multiple devices may include overlapping components. The components of the user device and the remote system 106, as illustrated herein are exemplary, and may be located in a stand-alone device or may be included, in whole or in part, as a component of a larger device or system, may be distributed across a network or multiple devices connected by a network, etc.

FIG. 12 illustrates examples of determining acoustic regions based on selection data and determining default devices for the acoustic regions according to embodiments of the present disclosure. Selection data 1210 may include first selections between a first device "A" and a second device B, second selections between a third device C and a fourth device D, third selections between the fourth device and a fifth device E, fourth selections between the third device C, the fourth device D and the fifth device E, and fifth selections between a sixth device F and a seventh device G. For example, the selection data 1210 indicates that the first selections selected the first device A 75% of the time and the second device B 25% of the time, the second selections selected the third device C 20% of the time and the fourth device D 80% of the time, the third selections selected the fourth device D 70% of the time and the fifth device E 30% of the time, the fourth selections selected the third device C 10% of the time, the fourth device D 70% of the time, and the fifth device E 20% of the time, and the fifth selections selected the sixth device F 25% of the time and the seventh device G 75% of the time. While the selection data 1210 only indicates percentages associated with the arbitration decisions, this is intended for ease of illustration and the disclosure is not limited thereto.

Based on the selection data 1210, the system 104 may group the devices into three different acoustic regions, as illustrated in acoustic region data 1220. For example, a first acoustic region may include the sixth device F and the seventh device G, a second acoustic region may include the third device C, the fourth device D, and the fifth device E, and a third acoustic region may include the first device A and the second device B. Based only on the selection data 1210, the system 104 may determine that that the seventh device G is the default device for the first acoustic region, that the fourth device D is the default device for the second acoustic region, and the first device A is the default device for the third acoustic region.

In some examples, the system 104 may determine the default device for an acoustic region based on output capabilities of the devices.

Based on the selection data 1210, for example, the system 104 may determine acoustic region data 1220. For example, the system 104 may determine that the seventh device G is the default device for the first acoustic region (e.g., best location based on the selection data, also because it is an independent device that doesn't require a separate component to be powered on), that the fourth device D is the default device for the second acoustic region (e.g., best location based on the selection data), and the second device B is the default device for the third acoustic region.

In examples, the system 104 may receive selection data indicating one or more selections (e.g., arbitration decisions) between a particular combination of the devices. For example, the selection data may indicate individual arbitration decisions (e.g., which of the devices A/B/C were included in a particular arbitration decision and which of the devices was chosen by the arbitration decision) and/or statistics associated with collective arbitration decisions (e.g., which of the devices A/B/C were selected between and statistics of how frequently each of the devices was chosen). In some examples, the selection data may correspond to devices that are associated with a user profile, although the disclosure is not limited thereto.

The system 104 may use the selection data to determine an acoustic region that includes a number of devices that are in proximity to each other. Thus, the selection data may indicate that multiple devices captured speech from a user at the same time, which corresponds to the multiple devices being within earshot of the user. For example, first selection(s) between the first device A and the second device B may indicate to the system 104 that the first device A is in proximity to the second device B, and second selection(s) between the second device B and the third device C may indicate to the system 104 that the second device B is in proximity to the third device C. Thus, the system 104 may generate a first acoustic region that includes the first device A, the second device B, and the third device C based on the first selection(s) and the second selection(s).

Additionally or alternatively, third selection(s) between the first device A, the second device B, and the third device C may indicate to the system 104 that the devices A/B/C are in proximity to each other and the system 104 may generate the first acoustic region based on the third selection(s). In examples, the system 104 may select all of the devices included in overlapping arbitration decisions as part of an acoustic region. For example, if a first arbitration decision of the selection data includes three devices A-C, the system 104 may group the three devices A-C in a first acoustic region. In addition, if one or more of the three devices A-C are included in a second arbitration decision of the selection data, the system 104 may add additional devices to the first acoustic region. For example, a second arbitration decision may involve four devices A-D, including devices B and C, and the system 104 may add the devices A and D to the first acoustic region.

However, the disclosure is not limited thereto and the system 104 may not select all of the devices included in an arbitration decision as part of a single acoustic region. For example, the selection data may include an indication of signal strength associated with each of the arbitration decisions, enabling the system 104 to distinguish between a strong signal and a weak signal. Thus, the system 104 may identify that the three devices included in the first arbitration decision are associated with a strong signal strength value and include all three devices A-C in the first acoustic region, but may determine that the two additional devices D and E are associated with a weak signal strength value and may not include them in the first acoustic region. Thus, despite the devices D and E being included in the second arbitration decision, the system 104 may not include them in the same acoustic region as devices A-C.

Figure 13:
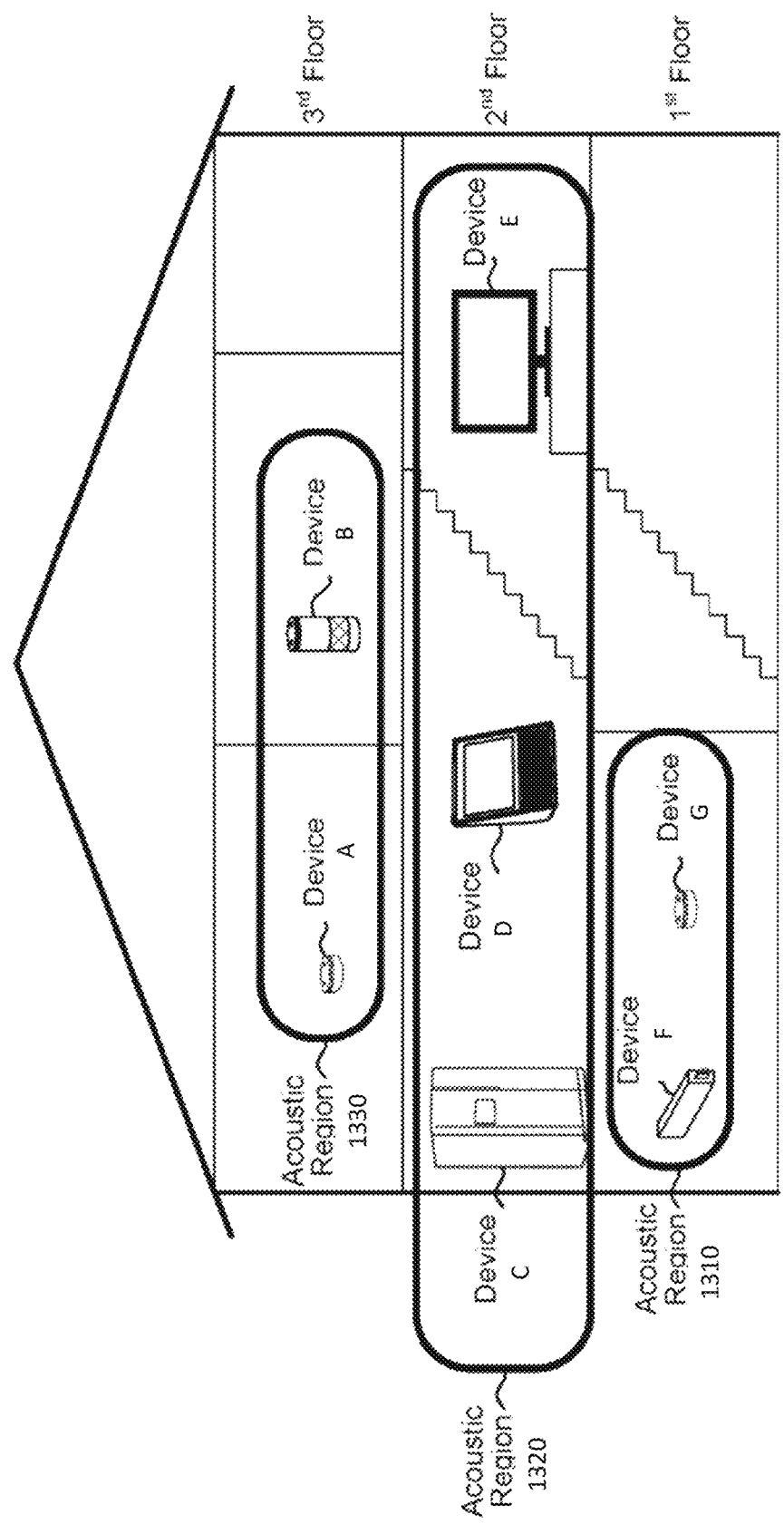
FIG. 13 illustrates examples of determining acoustic regions and generating virtual group(s) according to embodiments of the present disclosure.

FIG. 13 illustrates examples of determining acoustic regions and generating virtual group(s) according to embodiments of the present disclosure. For example, a first acoustic region 1310 includes a sixth device F and a seventh device G, a second acoustic region 1320 includes a third device C, a fourth device D, and a fifth device E, and a third acoustic region 1330 includes the first device A and the second device B.

In examples, the system 104 may generate a virtual group for each of the acoustic regions 1310/1320/1330. For example, the system 104 may generate a first virtual group for the first acoustic region 1310, a second virtual group for the second acoustic region 1320, and a third virtual group for the third acoustic region 1330. Thus, the system 104 may send data to each device in the first acoustic region 1310 by sending the data to the first virtual group, may send data to each device in the second acoustic region 1320 by sending the data to the second virtual group, and may send data to each device in the third acoustic region 1330 by sending the data to the third virtual group.

The system 104 may select a single device as a "master" device or controller for each of the virtual groups. For example, the system 104 may select the default device for each virtual group as the controller for that virtual group. The controller may control the devices included in the virtual group (e.g., remaining devices in the acoustic region), communicate with other devices in the system, such as the system 104, on behalf of the virtual group, and/or relay data from the system 104 to the remaining devices. For example, a first controller (e.g., fourth device D) for the second acoustic region 1320 (e.g., second virtual group) may control the remaining devices C/E and may send audio data to the remaining devices C/E so that the devices C/E collectively generate output audio that is synchronized.

Thus, if the system 104 sends data (e.g., notification data, audio data, and/or the like) to the first controller, the first controller may relay the data to the devices C/E. As long as the controller for a virtual group is responsive to communication from the system 104, the system 104 may send data to the virtual group via the controller even if another device within the virtual group is unresponsive to communication from the system 104 (e.g., not connected to the network(s) 106, not powered on, etc.).

To generate a virtual group, the system 104 may determine configuration information such as a device identification (ID) (e.g., unique identifier associated with each device), a physical location (e.g., upstairs bedroom, downstairs living room or the like), a network address (e.g., Internet Protocol (IP) address or the like), a type of input device, a type of output device, commands/features associated with the output device, and/or the like. The system 104 may receive the configuration information directly from a device, indirectly from the controller (e.g., a controller may send configuration information associated with an acoustic region), via spoken input from a user, via a companion application having a graphical user interface (GUI), and/or the like.

As discussed above, the system 104 may also determine default devices for each of the acoustic regions 1310/1320/1330. For example, the acoustic region data 1220 indicated that the seventh device G was the default device for the first acoustic region 1310, the fourth device D was the default device for the second acoustic region 1320, and the second device B was the default device for the third acoustic region 1330.

In examples, the system 104 may also generate a virtual group for the default devices. For example, the system 104 may generate a virtual group that includes the seventh device G associated with the first acoustic region 1310, the fourth device D associated with the second acoustic region 1320, and the second device B associated with the third acoustic region 1330. By sending data to the virtual group, the system 104 may send data to a single device in each of the acoustic regions 1310/1320/1330. For example, the system 104 may send notification data to the virtual group in order for the system to output a single notification in each of the acoustic regions 1310/1320/1330.

The identification of acoustic regions and/or the selection data 1210 and/or the acoustic region data 1220 may be utilized by the systems described herein to determine which devices are associated with each other and/or which devices are located in the same room or otherwise space as each other. With this data, device representations of the devices may be assigned coordinates in the grid-based coordinate system to represent the spatial relationship between devices. This information may be useful for generation user interfaces to present the device representations in association with a floor plan of a building.

While the foregoing invention is described with respect to the specific examples, it is to be understood that the scope of the invention is not limited to these specific examples. Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Although the application describes embodiments having specific structural features and/or methodological acts, it is to be understood that the claims are not necessarily limited to the specific features or acts described. Rather, the specific features and acts are merely illustrative some embodiments that fall within the scope of the claims.

What is claimed is:

1. A system, comprising:
one or more processors; and
non-transitory computer-readable media storing computer-executable instructions that, when executed by the one or more processors, cause the one or more processors to perform operations comprising:
receiving image data corresponding to an image depicting an exterior of a building and surroundings of the building;
generating, utilizing computer vision processing, first data that separates a portion of the image data corresponding to the building from the surroundings of the building, the first data representing first coordinates in a coordinate system that correspond to the building;
generating, using the first data, second data representing a floor plan corresponding to the building, the second data representing a portion of the first coordinates that correspond to exterior wall representations arranged in a shape of the building; and
determining, utilizing account data indicating devices associated with the building, third data indicating second coordinates that correspond to a location of a first device associated with the building; and
generating, utilizing at least the portion of the first coordinates and the second coordinates, a user interface including:
a first visual representation of the floor plan;
a second visual representation of the first device, the second visual representation positioned on the first visual representation to indicate placement of the first device in the building, the second visual representation selectable to cause operation of the first device; and
a third visual representation of a second device at third coordinates that are closer to the second coordinates than to fourth coordinates corresponding to a location of a third device, wherein the third coordinates are closer to the second coordinates than to the fourth coordinates based at least in part on fourth data indicating that the first device is utilized to control the second device more often than the third device is utilized to control the second device.

2. The system of claim 1, the operations further comprising:
storing fifth data indicating a first naming indicator of the first device;
determining that the first naming indicator includes a room name;
determining a portion of the first coordinates associated with the room name; and
wherein determining the third data indicating the second coordinates includes determining the portion of the first coordinates associated with the room name.

3. The system of claim 1, the operations further comprising:
storing:
fifth data indicating a first wireless signal strength from signals sent between the first device and the second device; and sixth data indicating a second wireless signal strength from signals sent between the first device and the third device;

determining, utilizing the fourth data and the fifth data, that the first wireless signal strength is stronger than the second wireless signal strength; and wherein the third visual representation is positioned closer to the second coordinates than to the third coordinates in response to the first wireless signal strength being stronger than the second wireless signal strength.

4. A method, comprising:

generating, based at least in part on first data that separates a building from surroundings of the building, second data representing a floor plan of the building, the floor plan representing first coordinates of a coordinate system that correspond to exterior wall representations arranged in a shape of the building;

determining, utilizing account data indicating devices associated with the building, third data indicating second coordinates that correspond to a location of a first device associated with the building; and generating, based at least in part on the first coordinates and the second coordinates, a user interface including:
 a first visual representation of the floor plan;
 a second visual representation of the first device positioned on the first visual representation, the second visual representation selectable to cause operation of the first device; and
 a third visual representation of a second device at third coordinates, the third coordinates positioned closer to the second coordinates than to fourth coordinates corresponding to a location of a third device based at least in part on fourth data indicating that the first device is utilized to control the second device more often than the third device is utilized to control the second device.

5. The method of claim 4, further comprising:

storing fifth data indicating a first naming indicator of the first device;

determining that the naming indicator includes a room name;

determining a portion of the first coordinates associated with the room name; and wherein determining the third data indicating the second coordinates includes determining the portion of the first coordinates associated with the room name.

6. The method of claim 4, further comprising:

storing:
 fifth data indicating a first wireless signal strength from signals sent between the first device and the second device; and
 sixth data indicating a second wireless signal strength from signals sent between the first device and the third device;

determining, utilizing the fourth data and the fifth data, that the first wireless signal strength is stronger than the second wireless signal strength; and wherein the third visual representation being positioned closer to the second coordinates than to the fourth coordinates is based at least in part to the first wireless signal strength being stronger than the second wireless signal strength.

7. The method of claim 4, wherein the user interface includes an icon representing occurrence of an event, and the method further comprising:

receiving input data indicating that the icon has been placed in proximity to the second coordinates associated with the first device;

generating, based at least in part on receiving the input data, fifth data indicating that the first device is scheduled to perform an action upon occurrence of the event; and causing the user interface to include an indication that the first device is scheduled to perform the action upon occurrence of the event.

8. The method of claim 4, further comprising:

receiving, from at least one of the devices or a remote system associated with the first device, fifth data indicating an operational state of the first device;

causing the user interface to include a first indication of the operational state of the first device;

determining that the operational state differs from a historical operational state of the first device; and causing the user interface to include a second indication that the operational state differs from the historical operational state.

9. The method of claim 4, further comprising:

receiving first input data indicating that the second visual representation and the third visual representation have been placed in a location corresponding to a portion of the first coordinates representing a room of the floor plan;

associating the first device and the second device as a device group based at least in part on the first input data;

receiving second input data indicating a naming indicator for the room; and associating the device group with the naming indicator based at least in part on the second input data.

10. The method of claim 4, further comprising:

receiving first input data indicating that the second visual representation has been placed in a location corresponding to a portion of the first coordinates representing a room of the floor plan;

receiving second input data indicating selection, on a user device displaying the user interface, of a naming indicator of the room; and causing, based at least in part on the first input data and receiving the second input data, the first device to perform an operation.

11. A system, comprising:

one or more processors; and non-transitory computer-readable media storing computer-executable instructions that, when executed by the one or more processors, cause the one or more processors to perform operations comprising:
 generating, based at least in part on first data that separates a building from surroundings of the building, second data representing a floor plan of the building, the floor plan representing first coordinates of a coordinate system that correspond to exterior wall representations arranged in the shape of the building;
 determining, utilizing account data indicating devices associated with the building, third data indicating second coordinates that correspond to a location of a first device associated with the building; and
 generating, based at least in part on the first coordinates and the second coordinates, a user interface including:

a first visual representation of the floor plan;
a second visual representation of the first device positioned on the first visual representation, the second visual representation selectable to cause operation of the first device; and
a third visual representation of a second device at third coordinates, the third coordinates positioned closer to the second coordinates than to fourth coordinates corresponding to a location of a third device based at least in part on fourth data indicating that the first device is utilized to control the second device more often than the third device is utilized to control the second device.

12. The system of claim 11, the operations further comprising:
storing fifth data indicating a first naming indicator of the first device;
determining that the naming indicator includes a room name;
determining a portion of the first coordinates associated with the room name; and
wherein determining the third data indicating the second coordinates includes determining the portion of the first coordinates associated with the room name.

13. The system of claim 11, the operations further comprising:
storing:
fifth data indicating a first wireless signal strength from signals sent between the first device and the second device; and
sixth data indicating a second wireless signal strength from signals sent between the first device and the third device;
determining, utilizing the fourth data and the fifth data, that the first wireless signal strength is stronger than the second wireless signal strength; and
wherein the third visual representation is positioned closer to the second coordinates than to the fourth coordinates based at least in part on the first wireless signal strength being stronger than the second wireless signal strength.

14. The system of claim 11, wherein the user interface includes an icon representing occurrence of an event, and the operations further comprise:
receiving input data indicating that the icon has been placed in proximity to the second coordinates associated with the first device;
generating, based at least in part on receiving the input data, third data indicating that the first device is scheduled to perform an action upon occurrence of the event; and
causing the user interface to include an indication that the first device is scheduled to perform the action upon occurrence of the event.

15. The system of claim 11, the operations further comprising:
receiving, from at least one of the first device or a remote system associated with the first device, third data indicating an operational state of the first device;
causing the user interface to include a first indication of the operational state of the first device;
determining that the operational state differs from a historical operational state of the first device; and
causing the user interface to include a second indication that the operational state differs from the historical operational state.

16. The operations of claim 11, the operations further comprising:
receiving first input data indicating that the second visual representation and the third visual representation have been placed in a location corresponding to a portion of the first coordinates representing a room of the floor plan;
associating the first device and the second device as a device group based at least in part on the first input data;
receiving second input data indicating a naming indicator for the room; and
associating the device group with the naming indicator based at least in part on the second input data.

17. The system of claim 11, the operations further comprising:
receiving first input data indicating that the second visual representation has been placed in a room of the floor plan;
receiving second input data indicating selection, on a user device displaying the user interface, of a naming indicator of the room; and
causing, based at least in part on the first input data and receiving the second input data, the first device to perform an operation.

18. The method of claim 4, further comprising:
causing the user interface to display an icon associated with an ingress point;
receiving user input data requesting placement of the icon; and
associating a portion of the user interface with a room based at least in part on the placement of the icon.

19. The method of claim 4, further comprising associating a portion of the first visual representation with a room name based at least in part on user input data indicating placement of the first device on the first visual representation.

20. The method of claim 4, further comprising causing display of the second visual representation in a room of the first visual representation based at least in part on receiving user input data indicating a name of the room, the name of the room corresponding at least in part to a naming indicator of the first device.

* * * * *